(12) United States Patent
Yamoto et al.

(10) Patent No.: US 11,891,474 B2
(45) Date of Patent: Feb. 6, 2024

(54) CURABLE RESIN COMPOSITION, DRY FILM, RESIN-CLAD COPPER FOIL, CURED PRODUCT, AND ELECTRONIC COMPONENT

(71) Applicant: TAIYO HOLDINGS CO., LTD., Saitama (JP)

(72) Inventors: Kazuhisa Yamoto, Hiki-gun (JP); Yoshitomo Aoyama, Hiki-gun (JP); Hidekazu Miyabe, Hiki-gun (JP)

(73) Assignee: TAIYO HOLDINGS CO., LTD., Hiki-gun (JP)

( * ) Notice: Subject to any disclaimer, the term of this patent is extended or adjusted under 35 U.S.C. 154(b) by 127 days.

(21) Appl. No.: 17/299,719

(22) PCT Filed: Dec. 4, 2019

(86) PCT No.: PCT/JP2019/047428
§ 371 (c)(1),
(2) Date: Jun. 3, 2021

(87) PCT Pub. No.: WO2020/116512
PCT Pub. Date: Jun. 11, 2020

(65) Prior Publication Data
US 2022/0049048 A1 Feb. 17, 2022

(30) Foreign Application Priority Data

Dec. 4, 2018 (JP) ................................. 2018-227152
Sep. 30, 2019 (JP) ................................. 2019-179638

(51) Int. Cl.
| | |
|---|---|
| C08G 59/42 | (2006.01) |
| C08K 3/013 | (2018.01) |
| H05K 1/03 | (2006.01) |
| H05K 1/18 | (2006.01) |
| H05K 3/28 | (2006.01) |
| C08K 3/36 | (2006.01) |
| C08G 59/32 | (2006.01) |
| C08K 5/12 | (2006.01) |
| C08K 9/06 | (2006.01) |
| C08L 63/00 | (2006.01) |

(52) U.S. Cl.
CPC .............. *C08G 59/42* (2013.01); *C08K 3/013* (2018.01); *H05K 1/03* (2013.01); *H05K 1/188* (2013.01); *H05K 3/28* (2013.01); *H05K 2201/0358* (2013.01)

(58) Field of Classification Search
None
See application file for complete search history.

(56) References Cited

U.S. PATENT DOCUMENTS

| | | | |
|---|---|---|---|
| 2016/0208143 A1 | 7/2016 | Shim et al. | |
| 2017/0290149 A1* | 10/2017 | Nakamura | C08G 59/686 |
| 2018/0327541 A1* | 11/2018 | Arita | H05K 1/0353 |
| 2022/0227942 A1* | 7/2022 | Li | C08K 7/00 |

FOREIGN PATENT DOCUMENTS

| | | | |
|---|---|---|---|
| JP | 2011-174035 A | 9/2011 | |
| JP | 5396805 B2 | 1/2014 | |
| JP | 2014047318 A * | 3/2014 | ............... C08J 5/24 |
| JP | 2014-208764 A | 11/2014 | |
| JP | 2016-69519 A | 5/2016 | |
| JP | 2016-132777 A | 7/2016 | |
| JP | 2018-172519 A | 11/2018 | |
| JP | 2019-183070 A | 10/2019 | |
| KR | 10-2016-0088753 A | 7/2016 | |
| TW | 201418358 A | 5/2014 | |
| TW | 201632582 A | 9/2016 | |
| WO | WO-2016098488 A1 * | 6/2016 | ............. B41J 2/085 |

OTHER PUBLICATIONS

International Search Report dated Feb. 10, 2020 in PCT/JP2019/047428 filed on Dec. 4, 2019, 3 pages.
Office Action dated May 30, 2023 in corresponding Taiwanese Patent Application No. 108144219, 11 pages.

* cited by examiner

*Primary Examiner* — Randy P Gulakowski
*Assistant Examiner* — Ha S Nguyen
(74) *Attorney, Agent, or Firm* — Oblon, McClelland, Maier & Neustadt, L.L.P.

(57) ABSTRACT

To provide a curable resin composition, from which a cured product having high heat resistance, a low dielectric loss tangent, high adhesion to a conductor can be obtained. A dry film, a resin-clad copper foil, a cured product, and an electronic component containing the curable resin composition are to be provided. A curable resin composition containing (A) an epoxy resin and (B) a compound having an active ester group is obtained, which has ratio of the total amount of epoxy group(s) in (A) the epoxy resin/the total amount of active ester group(s) in (B) the compound having an active ester group in the composition in the range of 0.2 to 0.6. A dry film, a resin-clad copper foil, a cured product, and an electronic component containing the curable resin composition are also obtained.

20 Claims, No Drawings

CURABLE RESIN COMPOSITION, DRY FILM, RESIN-CLAD COPPER FOIL, CURED PRODUCT, AND ELECTRONIC COMPONENT

CROSS-REFERENCE TO RELATED APPLICATIONS

This application is a national stage application of International Application No. PCT/JP2019/047428, filed Dec. 4, 2019, which is based upon and claims the benefit of priority to Japanese Patent Applications No. 2018-227152, filed Dec. 4, 2018 and No. 2019-179638, filed Sep. 30, 2019. The entire contents of these applications are incorporated herein by reference.

TECHNICAL FIELD

The present invention relates to a curable resin composition, a dry film, a resin-clad copper foil, a cured product, and an electronic component.

BACKGROUND ART

As an insulating material for forming electronic components such as printed circuit boards, thermosetting resin compositions containing epoxy resins have been used until now, and various curing agents are usually used in combination with epoxy resins to impart various characteristics to the cured products (for example, Patent Document 1).

PRIOR ART DOCUMENT

Patent Document

[Patent Document 1]
Japanese Patent No. 5396805

SUMMARY OF INVENTION

Object to be Achieved by the Invention

However, a curable resin composition for forming insulating layers of electronic components is desired to be able to form a cured product which is excellent in heat resistance from the viewpoints of reliability or the like. Moreover, since the transmission loss tends to increase with the adoption of high-speed communication, namely an increase in frequency, a decrease in the dielectric loss tangent which can suppress transmission loss is desired for insulating materials of electronic components in recent years.

An object of the present invention in view of the object is to provide a thermosetting resin composition with which a cured product having high heat resistance and a low dielectric loss tangent can be obtained, as well as a dry film having a resin layer obtained from the composition, a resin-clad copper foil and the cured product, and an electronic component.

Means for Achieving the Object

The present inventors have found that the object of the present invention is achieved by a curable resin composition comprising (A) an epoxy resin and (B) a compound having an active ester group, wherein the ratio of the total amount of epoxy group(s) in (A) the epoxy resin/the total amount of active ester group(s) in (B) the compound having an active ester group in the composition is in the range of 0.2 to 0.6.

(B) The above-mentioned compound having an active ester group is preferably a compound represented by the following general formula (1):

[Formula 1]

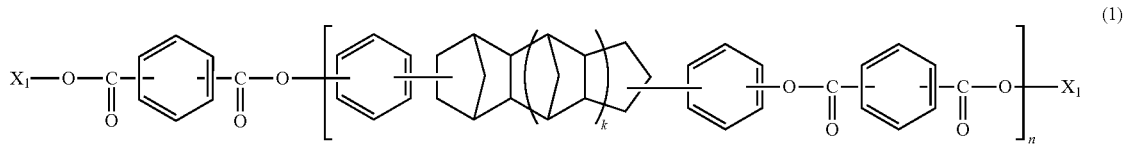

wherein $X_1$ is each independently a group having a benzene ring or a naphthalene ring, k represents 0 or 1, and n representing an average number of repeating units is 0.25 to 1.5.

(B) The compound having an active ester group is preferably a compound having a structural moiety represented by the following general formula (2):

[Formula 2]

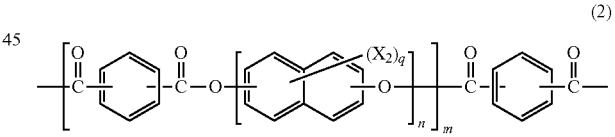

wherein, in the formula (2), Each X2, independently from each other, is a group represented by the following formula (3):

[Formula 3]

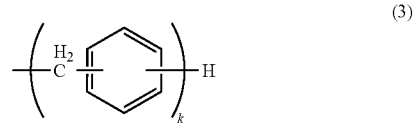

or a group represented by the following formula (4):

[Formula 4]

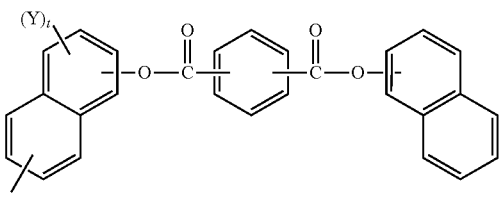

(4)

wherein m is an integer of 1 to 6, each n, independently from each other, is an integer of 1 to 5, and each q, independently from each other, is an integer of 1 to 6,
wherein, in the formula (3), each k, independently from each other, is an integer of 1 to 5,
wherein, in the formula (4), Y is a group represented by the above-mentioned formula (3) wherein each k, independently from each other, is an integer of 1 to 5, and each t, independently from each other, is an integer of 0 to 5, and having a structure with monovalent aryloxy groups at the both ends thereof.

The curable resin composition of the present invention preferably further comprises (C) an inorganic filler.

(A) The epoxy resin can comprise (A-1) an epoxy resin having a nitrogen atom (also referred to as A-1 component) and (A-2) an epoxy resin having no nitrogen atom (also referred to as A-2 component).

The object of the present invention is achieved also by a dry film comprising the above-mentioned curable resin composition as a resin layer;
a resin-clad copper foil, comprising the above-mentioned curable resin composition on copper foil or copper foil with a carrier as a resin layer;
a cured product of the above-mentioned curable resin composition, the resin layer of the dry film, or the resin layer of the resin-clad copper foil; and
an electronic component comprising the above-mentioned cured product.

Effects of Invention

According to a curable resin composition of the present invention, the obtained cured product has both high heat resistance and a low dielectric loss tangent. A dry film comprising a resin layer obtained from the curable resin composition of the present invention; a resin-clad copper foil, comprising a resin layer obtained from the curable resin composition of the present invention; a cured product of the curable resin composition of the present invention, the resin layer of the dry film, or the resin layer of the resin-clad copper foil; and an electronic component comprising this cured product each also have both high heat resistance and a low dielectric loss tangent.

MODE FOR CARRYING OUT THE INVENTION

<Curable Resin Composition>

A curable resin composition of the present invention is a composition comprising
(A) an epoxy resin (also referred to as A component) and
(B) a compound having an active ester group (also referred to as B component), wherein the ratio of the total amount of epoxy group(s) in (A) the epoxy resin/the total amount of active ester group(s) in (B) the compound having an active ester group in the composition is 0.2 to 0.6.

The above-mentioned total amount of the epoxy groups can be obtained by dividing the amount of (A) the epoxy resin blended and contained in the composition by the epoxy equivalent of (A) the epoxy resin. The total amount of the active ester groups of (B) the compound having an active ester group can be obtained by dividing the amount of (B) the compound having an active ester group blended and contained in the composition by the active ester equivalent of (B) the compound having an active ester group.

Although the A component and the B component may each contain a plurality of compounds as mentioned below, in that case, as to every compound, the total amount of the epoxy groups or the total amount of the ester groups is obtained by dividing the amount blended by the epoxy equivalent or the active ester equivalent.

When the curable resin composition of the present invention contains the A component and the B component, and the ratio between the total amounts is 0.2 to 0.6, a cured product having both high heat resistance and a low dielectric loss tangent can be obtained.

Since, as mentioned above, a cured product having high glass transition temperature (Tg) and a low dielectric loss tangent is obtained, the ratio of the total amount of the epoxy groups of (A) the epoxy resin/the total amount of the active ester groups of (B) the compound having an active ester group is more preferably 0.2 to 0.5 and particularly preferably 0.2 to 0.4.

In the past, it was considered that when the compound having an active ester group was blended in a large amount as a curing agent, the heat resistance deteriorated. However, a cured product having high glass transition temperature (Tg), a low dielectric loss tangent, and a low coefficient of linear thermal expansion can be obtained unexpectedly. It is considered that the detailed mechanism is not clear, but when the rate of the compound having an active ester group, preferably the compound having an active ester group and having the structure of the above-mentioned general formula (1) or (2), was increased, the movement of chain-like portions between crosslinking points was controlled by increasing the volume rate of the structure of an active ester, namely the rigid aromatic ester structure having high molecular orientation, and the glass transition temperature was therefore improved.

(A) The epoxy resin preferably contains at least one of a tri- or higher functional liquid epoxy resin and a tri- or higher functional semisolid epoxy resin. When the epoxy resin contains a tri- or higher functional liquid epoxy resin or a tri- or higher functional semisolid epoxy resin, the glass transition temperature can be improved with the dielectric loss tangent maintained low.

The curable resin composition of the present invention may contain (C) an inorganic filler (also referred to as C component).

(A) The epoxy resin contained in the curable resin composition of the present invention may comprise (A-1) an epoxy resin containing a nitrogen atom and (A-2) an epoxy resin containing no nitrogen atom. The use of both A-1 component and A-2 component as the A component enables further improving the adhesion to a conductor with excellent heat resistance and a low dielectric loss tangent maintained.

In this case, the ratio of the total amount of the epoxy groups in (A-1) the epoxy resin containing a nitrogen atom and (A-2) the epoxy resin containing no nitrogen atom to the total amount of the ester groups in (B) the compound having an active ester group is preferably 0.2 to 0.6.

The total amount of the epoxy groups in this case is the sum of (i) a value obtained by dividing the amount of (A-1) the epoxy resin containing a nitrogen atom blended and contained in the composition by the epoxy equivalent of (A-1) the epoxy resin containing a nitrogen atom and (ii) a value obtained by dividing the amount of (A-2) the epoxy resin containing no nitrogen atom blended and contained in the composition by the epoxy equivalent of (A-2) the epoxy resin containing no nitrogen atom.

Components which the thermosetting resin composition of the present invention contains will be described hereinafter. When a numerical value range is referred to as " . . . to . . . ," the range means a range including those values (namely . . . or more and . . . or less) herein.

[(A) Epoxy Resin]

The thermosetting resin composition of the present invention contains one or more (A) epoxy resins. (A) The epoxy resin can be prepared as a mixture of (A-1) the epoxy resin containing a nitrogen atom and (A-2) the epoxy resin containing no nitrogen atom.

[(A-1) Epoxy Resin Containing Nitrogen Atom]

(A-1) The epoxy resin containing a nitrogen atom/atoms is a compound having one or more nitrogen atom(s) and an epoxy group.

Examples thereof include a Bifunctional epoxy resin having one to four nitrogen atoms and two epoxy groups in a molecule or a polyfunctional epoxy resin which is a tri- or higher functional epoxy resin having one to four nitrogen atoms and three or more epoxy groups in a molecule. As long as the epoxy resin contains a nitrogen atom, the epoxy resin may be a hydrogenated epoxy resin.

(A-1) The epoxy resin containing a nitrogen atom is represented by the following (A-1-1), (A-1-2), or (A-1-3):

[Formula 5]

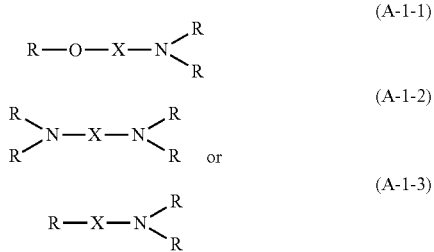

wherein X is each phenylene, naphthalene, biphenylene, or methylene diphenyl, which is represented by the following formula:

[Formula 6]

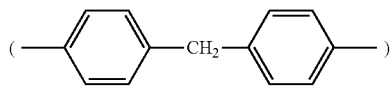

and may be substituted with 1 to 6, preferably 1 or 2, alkyl groups having 1 or more and 3 or less carbon atoms, especially methyl, furthermore, a plurality of R in the formulae is each independently a glycidyl group, an alkyl group, or a hydrogen atom; however, 1 or more, preferably 2 or more R are glycidyl groups. Examples of the alkyl group include linear or branched alkyl groups having 1 or more and 6 or less, preferably 1 or more and 3 or less, carbon atoms. More specific examples of the alkyl group include methyl group, ethyl group, propyl group, isopropyl group, butyl group, isobutyl group, sec-butyl group, tert-butyl group, pentyl group, and hexyl group. The alkyl group is preferably a methyl group or an ethyl group.

Other examples of (A-1) the epoxy resin containing a nitrogen atom include epoxy resins having a heterocyclic skeleton, for example, a triazine skeleton. Examples thereof include triglycidyl isocyanurate (TEPIC series such as TEPIC-VL manufactured by Nissan Chemical Corporation).

(A-1) Among epoxy resins containing a nitrogen atom(s), a glycidyl amine type epoxy resin having one to four, especially three or four, epoxy groups is preferable.

Specific examples of the trifunctional or tetrafunctional glycidyl amine type epoxy resin include N,N,O-triglycidyl-m-aminophenol (manufactured by Huntsman Advanced Materials, Araldite® MY0600), N,N,O-triglycidyl-4-amino-3-methylphenol, N,N,N',N'-tetraglycidyl-4,4'-methylenedianiline (manufactured by Mitsubishi Chemical Corporation, jER® 604), tetraglycidyldiaminodiphenylmethane (manufactured by Huntsman Advanced Materials, Araldite® MY721) N,N-bis(oxiranylmethyl)-4-(oxiranylmethoxy)aniline (N,N,O-triglycidyl-p-aminophenol, manufactured by Mitsubishi Chemical Corporation, jER® 630 and JER® 630LSD; EP-3950S and EP-3950SL manufactured by ADEKA Corporation; or Araldite® MY0500 manufactured by Huntsman Advanced Materials), N,N,N',N'-tetraglycidyl-2,2'-diethyl-4,4'-methylenedianiline, and N,N,N',N'-tetraglycidyl-m-xylylene diamine.

Specific examples of the Bifunctional glycidyl amine type epoxy resin include N,N-diglycidylaniline, N,N-bis(oxiranylmethyl)-2-(methylaniline)(N,N-diglycidyl-o-toluidine, EP-3980S manufactured by ADEKA Corporation).

Besides, a material obtained by urethane-modifying an epoxy resin can be used as (A-1) the epoxy resin containing a nitrogen atom, and specific examples thereof include EPU-73B manufactured by ADEKA Corporation.

Although (A-1) the epoxy resin containing a nitrogen atom may be any of a solid epoxy resin, a semisolid epoxy resin, and a liquid epoxy resin, it is preferable to use a liquid or semisolid epoxy resin, especially a liquid or semisolid glycidyl amine type epoxy resin with respect to the manufacturing of a dry film or a resin-clad copper foil.

Herein, the solid epoxy resin means an epoxy resin which is solid at 40° C., the semisolid epoxy resin means an epoxy resin which is solid at 20° C. and liquid at 40° C., and the liquid epoxy resin means an epoxy resin which is liquid at 20° C. The liquid state is determined in accordance with Kikenbutsu no Shiken oyobi Seijou ni kansuru Shourei (Heisei gan-nen Jichishorei dai 1-go) no Bessi dai-2 no "Ekijo no Kakunin Houhou" ("the method for confirming a liquid state" of Appendix 2 of the Ministerial Ordinance as to Tests and the Properties of Hazardous Materials (ministerial ordinance No. 1 of the Ministry of Home Affairs in Heisei 1)). For example, the liquid state is determined in the method described in paragraphs 23 to 25 of JP-A-2016-079384.

In the present invention, (A-1) the epoxy resin comprising a nitrogen atom preferably contains at least one of a tri- or higher functional liquid epoxy resin and a tri- or higher functional semisolid epoxy resin. When a tri- or higher functional liquid epoxy resin or a tri- or higher functional semisolid epoxy resin is contained, the glass transition temperature can be improved with a dielectric loss tangent maintained low. As a commercial item of such a tri- or higher functional liquid epoxy resin, for example, TEPIC- VL manufactured by Nissan Chemical Corporation, jER630 manufactured by Mitsubishi Chemical Corporation, or the like can be used. As a commercial item of such a tri- or higher functional semisolid epoxy resin, for example, jER604 manufactured by Mitsubishi Chemical Corporation or the like can be used.

In the past, it was considered that when the epoxy resin comprising a nitrogen atom, especially the glycidyl amine type epoxy resin, was used as a curing component of a resin composition, the crosslinking density of the cured product increased, high heat resistance was obtained, and the dielectric property however deteriorated.

Meanwhile, it was considered that since it was known that the compound having an active ester group had lower adhesion to a conductor than curing agents such as a phenol-based curing agent, in a curable resin composition in which the active ester groups were more than the epoxy groups like the above-mentioned ratio, the adhesion to a conductor deteriorated. However, when, in the curable resin composition of the present invention, (A-1) the epoxy resin comprising a nitrogen atom, (A-2) the epoxy resin containing no nitrogen atom, (B) the compound having an active ester group, and (C) the inorganic filler are used in combination, and the ratio of (A) the epoxy resin (comprising the A-1 component and the A-2 component) to (B) the compound having an active ester group is set to a specific range wherein the active ester groups are more, a cured product having all of high heat resistance, a low dielectric loss tangent, and high adhesion to a conductor is obtained. It is considered that such an effect was obtained partly because even though (A-1) the epoxy resin comprising a nitrogen atom was contained, the resin composition was cured at a moderate crosslinking density.

[(A-2) Epoxy Resin Containing No Nitrogen Atom]

(A-2) The epoxy resin containing no nitrogen atom is a resin having epoxy groups, and any of the known epoxy resins can be used. Preferable examples thereof include difunctional epoxy resins having two epoxy groups in a molecule and polyfunctional epoxy resins having three or more epoxy groups in a molecule. The epoxy resin may be a hydrogenated epoxy resin. Although (A-2) the epoxy resin containing no nitrogen atom may be any one or more of a solid epoxy resin, a semisolid epoxy resin, and a liquid epoxy resin, the epoxy resin is preferably a solid epoxy resin. Definitions of solid, semisolid, and liquid epoxy resins and a method for the determination thereof are as mentioned above as to (A-1) the epoxy resin containing a nitrogen atom.

Examples of the solid epoxy resin used as (A-2) the epoxy resin containing no nitrogen atom include naphthalene type epoxy resins such as EPICLON HP-4700 manufactured by DIC Corporation (naphthalene type epoxy resin), NC-7000L manufactured by Nippon Kayaku Co., Ltd. (naphthalene skeleton-containing polyfunctional solid epoxy resin), and ESN-475V manufactured by Nippon Steel Chemical Co., Ltd.; an epoxidized product of a condensate of a phenol and an aromatic aldehyde having phenolic hydroxyl groups (trisphenol type epoxy resin) such as EPPN-502H manufactured by Nippon Kayaku Co., Ltd. (trisphenol epoxy resin); dicyclopentadiene aralkyl type epoxy resins such as EPICLON HP-7200H manufactured by DIC Corporation (dicyclopentadiene skeleton-containing polyfunctional solid epoxy resin); biphenyl aralkyl type epoxy resins such as NC-3000H and NC-3000L manufactured by Nippon Kayaku Co., Ltd. (biphenyl skeleton-containing polyfunctional solid epoxy resin); novolac type epoxy resins such as EPICLON N660 and EPICLON N690 manufactured by DIC Corporation and EOCN-104S by Nippon Kayaku Co., Ltd.; biphenyl type epoxy resins such as YX-4000 manufactured by Mitsubishi Chemical Corporation; and phosphorus-containing epoxy resins such as TX0712 manufactured by Nippon Steel & Sumikin Chemical Co., Ltd. When a solid epoxy resin is contained, the glass transition temperature of the cured product increases, and the cured product is excellent in heat resistance. Since a cured product having higher Tg and a lower dielectric loss tangent is obtained, among solid epoxy resins, an epoxy resin having a skeleton in which phenol or naphthol is connected with an aromatic compound by methylene chains like ESN-475V or NC3000H is preferable.

Examples of the semisolid epoxy resin include bisphenol A type epoxy resins such as EPICLON 860, EPICLON 900-IM, EPICLON EXA-4816 and EPICLON EXA-4822 manufactured by DIC Corporation, Epotohto YD-134 manufactured by Tohto Kasei Co., Ltd., jER834 and jER872 manufactured by Mitsubishi Chemical Corporation, and ELA-134 manufactured by SUMITOMO CHEMICAL COMPANY, LIMITED; naphthalene type epoxy resins such as EPICLON HP-4032 manufactured by DIC Corporation; phenol novolac type epoxy resins such as EPICLON N-740 manufactured by DIC Corporation. When the semisolid epoxy resin is contained, the glass transition temperature (Tg) of the cured product increases, and the coefficient of linear thermal expansion (CTE) decreases, and the cured product is excellent in crack resistance. When the semisolid epoxy resin is contained, the storage stability of a dry film is excellent, and cracks and peeling can be prevented.

Examples of the liquid epoxy resin include bisphenol A type epoxy resins, bisphenol F type epoxy resins, bisphenol AF type epoxy resins, phenol novolac type epoxy resins, tert-butylcatechol type epoxy resins, alicyclic epoxy resins, and heterocyclic epoxy resins containing heteroatoms other than nitrogen. When the liquid epoxy resin is contained, the suppleness of a dry film can be improved.

Solid, liquid, and semisolid (A-2) epoxy resins containing no nitrogen atoms may be used in combination.

As mentioned above, (A) the epoxy resin may be used alone or in combination of two or more. When the solid content in the resin composition is 100% by mass, the amount of (A) the epoxy resin blended is preferably 40% by mass or less, more preferably 35% by mass or less, and particularly preferably 30% by mass or less from the viewpoint of giving a low dielectric loss tangent to the cured product of the curable resin composition. The lower limit is preferably 1% by mass or more and more preferably 3% by mass or more from the viewpoint of the strength of the cured product.

To improve the balance between the tack-free property and the pliability of the resin layer of a dry film, it is preferable to use (A-1) the epoxy resin containing a nitrogen atom and (A-2) the epoxy resin containing no nitrogen atom, and it is further preferable to set the ratio of the liquid epoxy resin and the semisolid epoxy resin to the total mass of the A-1 component and the A-2 component to the range of 5% to 50%.

One or more (A-1) epoxy resins containing the nitrogen atoms alone or one or more (A-2) epoxy resins containing no nitrogen atoms alone may be used, or one or more A-1 components and one or more A-2 components may be used in combination for (A) the epoxy resin depending on the characteristic of the curable resin composition to be obtained or its cured product. When a mixture of the A-1 component and the A-2 component are used, the amounts of (A-1) the epoxy resin containing a nitrogen atom and (A-2) the epoxy resin containing no nitrogen atom blended are preferably 40% by mass or less, more preferably 35% by mass or less, further more preferably 30% by mass or less, and particularly preferably 20% by mass or less based on 100% by mass of the solid content in the curable resin composition. A cured product having a lower coefficient of thermal expansion and lower hygroscopicity is obtained thereby. The lower limit is preferably 1% by mass or more, and more preferably 3% by mass or more from the viewpoint of the curability of the curable resin composition.

The ratio of the mass of the A-1 component to the total mass of (A-1) the epoxy resin comprising a nitrogen atom (A-1 component) and (A-2) the epoxy resin containing no nitrogen atom ((A-1)/(A-1)+(A-2)) is preferably 0.1 to 0.6.

As long as an effect of the present invention is not deteriorated, the curable resin composition of the present invention may contain a thermosetting resin other than (A-1) the epoxy resin comprising a nitrogen atom and (A-2) the epoxy resin containing no nitrogen atom. For example, a well-known thermosetting resin for common use such as an isocyanate compound, a block isocyanate compound, an amino resin, a benzoxazine resin, a carbodiimide resin, a cyclocarbonate compound, a polyfunctional oxetane compound, an episulfide resin, or a maleimide resin can be used.

[(B) Compound Having Active Ester Group]

The curable resin composition of the present invention contains (B) the compound having an active ester group as a curing agent of the A component.

(B) The compound having an active ester group is a compound having one or more, preferably two or more, active ester groups in one molecule. The compound having an active ester group can be generally obtained by the condensation reaction of a carboxylic acid compound and a hydroxy compound. Especially, a compound having an active ester group and obtained using a phenol compound or a naphthol compound as a hydroxy compound is preferable. Examples of the phenol compound or the naphthol compound include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac. (B) The compound having an active ester group may be a naphthalenediol alkyl/benzoic acid type. (B) The compound having an active ester group may be used alone or in combination of two or more. As (B) the compound having an active ester group, a compound having any of benzene, α-naphthol, β-naphthol and dicyclopentadiene skeletons is preferable.

When the solid content in the resin composition is 100% by mass, the upper limit of the amount of (B) the compound having an active ester group blended is preferably 50% by mass or less, more preferably 45% by mass or less, and particularly preferably 40% by mass or less from the viewpoint of the strength of the cured product. Since a cured product having lower dielectric loss tangent is obtained, the lower limit is preferably 3% by mass or more and more preferably 5% by mass or more.

In the curable resin composition of the present invention, the ratio of the total amount of the epoxy groups in (A) the epoxy resin to the total amount of the ester groups in (B) the compound having an active ester group is set to be in the range of 0.2 to 0.6. The amount of (B) the compound having an active ester group to be used is determined, with the above-mentioned ratio, as a matter of course.

Among (B) compounds having active ester groups, compounds having active ester groups of the following (B1) and (B2) can be appropriately used.

(B1) The compound having an active ester group has a structure obtained by reacting (b1) a phenol resin having a molecular structure in which phenols are connected by alicyclic hydrocarbon groups, (b2) an aromatic dicarboxylic acid or its halide, and (b3) an aromatic monohydroxy compound among one another. It is preferable to use a compound having a structure obtained by reacting (b1) the phenol resin, (b3) the aromatic monohydroxy compound, and (b2) the aromatic dicarboxylic acid or its halide so that the molar ratios of the phenolic hydroxyl groups in (b1) the phenol resin and (b3) the aromatic monohydroxy compound to the carboxyl groups or the acid halide groups in (b2) the aromatic dicarboxylic acid or its halide are 0.05 to 0.75 moles and 0.25 to 0.95/1, respectively.

Here, examples of the molecular structure in which phenols are connected by alicyclic hydrocarbon groups in (b1) the phenol resin include a structure obtained by subjecting an unsaturated alicyclic hydrocarbon compound containing two double bonds in one molecule and a phenol to polyaddition reaction. Here, examples of the phenol include unsubstituted phenols and phenols substituted with one or a plurality of groups of alkyl groups, alkenyl groups, allyl groups, aryl groups, aralkyl groups, halogen groups, or the like. As specific examples of the substituted phenol, cresol, xylenol, ethylphenol, isopropylphenol, butylphenol, octylphenol, nonylphenol, vinylphenol, isopropenylphenol, allylphenol, phenylphenol, benzylphenol, chlorophenol, bromophenol, naphthol, dihydroxynaphthalene, and the like are illustrated, the substituted phenol is not, however, limited to these. A mixture of these may be used. Among these, an unsubstituted phenol is particularly preferable from the viewpoints of excellent fluidity and curability.

Specific examples of the unsaturated alicyclic hydrocarbon compound include dicyclopentadiene, tetrahydroindene, 4-vinylcyclohexene, 5-vinylnorborn-2-ene, α-pinene, β-pinene, and limonene. Among these, dicyclopentadiene is preferable from the viewpoint of the characteristic balance, especially heat resistance and hygroscopicity. Since dicyclopentadiene is contained in oil fractions, in dicyclopentadiene for industry, other aliphatic or aromatic dienes and the like may be contained as impurities. The dicyclopentadiene for industry is desirably a product with a dicyclopentadiene purity of 90% by mass or more in view of heat resistance, curability, moldability, and the like.

Examples of (b2) the aromatic dicarboxylic acid or its halide include aromatic dicarboxylic acids such as isophthalic acid, terephthalic acid, 1,4-, 2,3- or 2,6-naphthalene dicarboxylic acid; and acid halides such as acid fluorides, acid chlorides, an acid bromides, and an acid iodides thereof. Among these, the aromatic dicarboxylic acid or its halide is preferably an acid chloride of an aromatic dicarboxylic acid, and especially the dichloride of isophthalic acid and the dichloride of terephthalic acid are preferable, and particularly the dichloride of isophthalic acid is preferable from the viewpoint that especially the reactivity is good.

Examples of (b3) the aromatic monohydroxy compound include phenol; alkyl phenols such as o-cresol, m-cresol, p-cresol, and 3,5-xylenol; aralkyl phenols such as o-phenylphenol, p-phenylphenol, 2-benzylphenol, 4-benzylphenol, and 4-(α-cumyl)phenol; and naphthols such as α-naphthol and β-naphthol. Among these, α-naphthol and β-naphthol are preferable from the viewpoint that especially the dielectric loss tangent of a cured product decreases.

(B1) The active ester compound has a structure obtained by reacting (b1) the phenol resin, (b2) the aromatic dicarboxylic acid or its halide, and (b3) the aromatic monohydroxy compound. Especially, an active ester compound having a structure represented by the following general formula (1) is preferable:

[Formula 7]

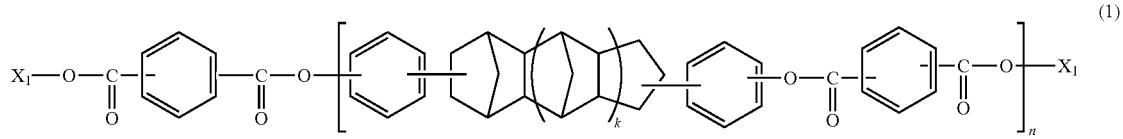

wherein $X_1$s are groups having a benzene ring or a naphthalene ring, k represents 0 or 1, and n is the average value of the number of repeating units, and is 0.05 to 2.5.

The compound of formula (1) is especially preferred since the dielectric loss tangent of the cured product becomes low, and the viscosity of a solution becomes low after the active ester compound is dissolved in an organic solvent. The group having the benzene ring or the naphthalene ring is not particularly limited, may be a phenyl group, a naphthyl group, or the like, or the benzene ring or the naphthalene ring may be bound to an end of a molecule through other atoms, or may have a substituent. (B1) The active ester compound preferably has a naphthalene ring at an end of a molecule thereof.

Especially an active ester compound in which the value of n, namely the average value of the number of repeating units, is in the range of 0.25 to 1.5 in the above-mentioned general formula (1) is preferable from the viewpoints that the viscosity of the solution is low, and the active ester compound is easily manufactured into a dry film for buildup. In the above-mentioned general formula (1), the value of k is preferably 0 from the viewpoints of high heat resistance and a low dielectric loss tangent.

Here, n in the above-mentioned general formula (1) can be determined as follows.

[Method for Determine n in General Formula (1)]

The ratios of theoretical molecular weights ($\beta 1$, $\beta 2$, $\beta 3$, and $\beta 4$) of n=1, n=2, n=3, and n=4, respectively, to molecular weights in terms of styrene ($\alpha 1$, $\alpha 2$, $\alpha 3$, and $\alpha 4$) corresponding to n=1, n=2, n=3, and n=4, respectively, ($\beta 1/\alpha 1$, $\beta 2/\alpha 2$, $\beta 3/\alpha 3$, and $\beta 4/\alpha 4$) are determined by GPC measurement performed under the following conditions, and the average value of these ($\beta 1/\alpha 1$ to $\beta 4/\alpha 4$) is calculated. A numerical value obtained by multiplying the number average molecular weight (Mn) determined by GPC by this average value is defined as an average molecular weight. Subsequently, the value of n is calculated by defining the molecular weight of the general formula (1) as the average molecular weight.

(GPC Measurement Conditions)

Measuring device: "HLC-8220 GPC" manufactured by Tosoh Corporation.
Column: Guard column "$H_{XL}$-L" manufactured by Tosoh Corporation+"TSK-GEL G2000HXL" manufactured by Tosoh Corporation+"TSK-GEL G2000HXL" manufactured by Tosoh Corporation+"TSK-GEL G3000HXL" manufactured by Tosoh Corporation+ "TSK-GEL G4000HXL" manufactured by Tosoh Corporation
Detector: RI (differential refractometer)
Data processing: "GPC-8020 model II version 4.10" manufactured by Tosoh Corporation
Measurement conditions: Column temperature 40° C.
Developing solvent: Tetrahydrofuran
Flow velocity: 1.0 ml/minute Standard: the following types of monodisperse polystyrene having known molecular weights were used in accordance with the measurement manual of the "GPC-8020 model II version 4.10."
(Used Polystyrene)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation
Sample: Sample obtained by filtering 1.0% by mass tetrahydrofuran solution in terms of resin solid content through microfilter (50 µl)

As the method for reacting (b1) the phenol resin, (b2) the aromatic dicarboxylic acid or its halide, and (b3) the aromatic monohydroxy compound, these components can be specifically reacted in the presence of an alkali catalyst.

Examples of an alkali catalyst which can be used here include sodium hydroxide, potassium hydroxide, triethylamine, and pyridine. Among these, especially sodium hydroxide and potassium hydroxide are preferable from the viewpoint that sodium hydroxide and potassium hydroxide can be used in the states of solutions, and the productivity is good.

Specific examples of the reaction include a method for mixing (b1) the phenol resin, (b2) the aromatic dicarboxylic acid or its halide, and (b3) the aromatic monohydroxy compound in the presence of an organic solvent to perform reaction while the alkali catalyst or its solution is dropped continuously or intermittently. In that case, the concentration of the solution of the alkali catalyst is preferably in the range of 3.0 to 30%. Examples of an organic solvent which can be used here include toluene and dichloromethane.

When the solution of the alkali catalyst is used, after the reaction, the reaction liquid is left to stand and separated into liquids, the aqueous layer is removed, the procedure is repeated until the aqueous layer after the residual organic layer is washed is almost neutral, and a resin of interest can be obtained.

The thus obtained compound having an active ester group of (B1) is usually obtained as an organic solvent solution. Therefore, when the compound is used as varnish for laminate sheets or a dry film for buildups, the compound itself is mixed with other blending components, the amount of the organic solvent is further optionally adjusted, and a thermosetting resin composition of interest can be produced. The active ester compound of (B1) is characterized in that the melt viscosity when the active ester compound is dissolved in the organic solvent and prepared as a resin solution is low. The solution viscosity when the compound having an active ester group is prepared as a toluene solution with a solid content of 65% is specifically 300 to 10,000 mPa·s (25° C.).

The compound having an active ester group of (B2) has a structural moiety represented by the following general formula (2):

[Formula 8]

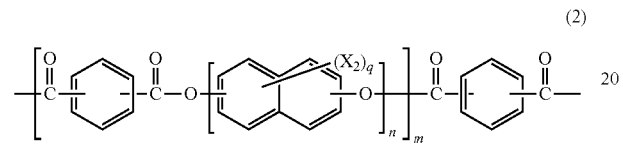

(2)

and has a structure with monovalent aryloxy groups at both ends thereof.

In the formula (2), Each $X_2$, independently from each other, is a group represented by the following formula (3):

[Formula 9]

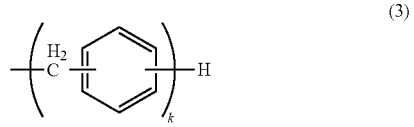

(3)

or a group represented by the following formula (4):

[Formula 10]

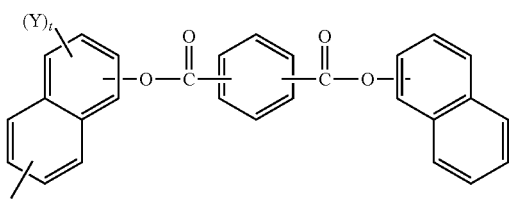

(4)

wherein m is an integer of 1 to 6, n is each independently an integer of 1 to 5, and q is each independently an integer of 0 to 6, wherein, in the formula (3), each k, independently from each other, is an integer of 1 to 5, wherein, in the formula (4), Y is a group represented by the above-mentioned formula (3) wherein each k, independently from each other, is an integer of 1 to 5, and t is each independently an integer of 0 to 5.

In the compound having an active ester group of (B2), in the general formula (2), a partial structure represented by the formula:

[Formula 11]

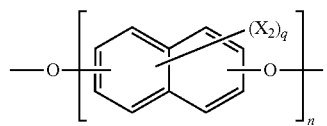

is preferably a structure derived from a modified naphthalene compound having a hydroxyl equivalent of 170 to 200 g/equivalent.

Although some patterns are illustrated below to clarify the relationship between m and n in the formula (2), the compound having an active ester group of (B2) is not limited to these.

For example, the formula (2) represents the structure of the following formula (2-I) at the time of m=1.

[Formula 12]

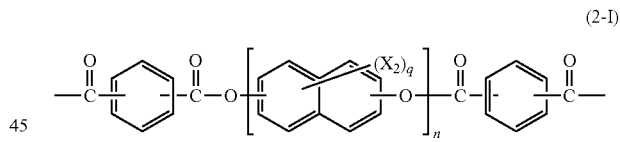

(2-I)

In the formula (2-I), n is an integer of 1 to 5, and when n is 2 or more, q is each independently an integer of 0 to 6.

For example, the formula (2) represents the structure of the following formula (2-II) at the time of m=2.

[Formula 13]

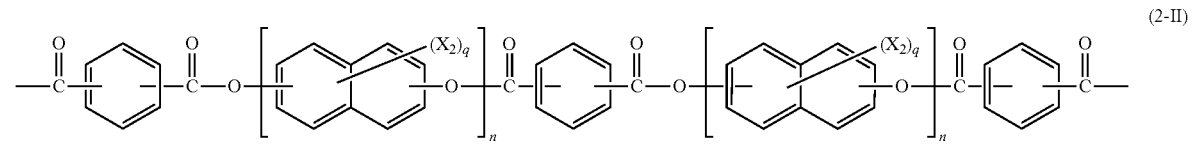

(2-II)

In the formula (2-II), n is each independently an integer of 1 to 5, and when n is 2 or more, q is each independently an integer of 0 to 6.

Since the compound having an active ester group of (B2) has a naphthylene ether structural moiety in the molecular main skeleton, more excellent heat resistance and fire retardancy can be imparted to the cured product. In addition, since the structural moiety is connected with a structural moiety represented by the following formula (5), the cured product can be made to have a more excellent dielectric property in combination. When the compound having an active ester group has aryloxy groups as structures at both ends in the structure of the compound having an active ester group of (B2), enough high thermal decomposition resistance of the cured product is improved also for multilayer printed circuit boards.

[Formula 14]

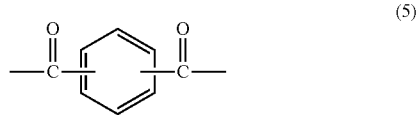

(5)

The compound having an active ester group of (B2) and having a softening point in the range of 100 to 200° C., especially in the range of 100 to 190° C., is preferable especially from the viewpoint of excellent heat resistance of the cured product.

Examples of the compound having an active ester group of (B2) include a compound having an active ester group of (B2) wherein m in the formula (2) is an integer of 1 to 6. Especially a compound having an active ester group of (B2) wherein m is an integer of 1 to 5 is preferable. Examples of the compound include a compound having an active ester group of (B2) wherein n in the formula (2) is each independently an integer of 1 to 5. Especially a compound having an active ester group of (B2) wherein ns is an integer of 1 to 3 is preferable.

When the relationship between in and n is described in the formula (2) for making sure, for example, in the case where in is an integer of 2 or more, 2 or more n are produced. In that case, n is each independent values. That is, as long as n is in the numerical value range of n, n may be the same value, or may be different value.

In the compound having an active ester group of (B2), when q is 1 or more in the formula (2), $X_2$ may be substituted at any position in the naphthalene ring structure.

Examples of the aryloxy groups of the both ends of the structure include aryloxy groups derived from monohydric phenolic compounds such as phenol, cresol, p-t-butylphenol (para-tertiary-butylphenol), 1-naphthol, and 2-naphthol. Especially a phenoxy group, a tolyloxy group, or a 1-naphthyloxy group is preferable, and the 1-naphthyloxy group is further preferable from the viewpoint of thermal decomposition resistance of the cured product.

A method for producing a compound having an active ester group of (B2) will be described in detail hereinafter.

The method for producing a compound having an active ester group of (B2) comprises: a step of reacting a dihydroxynaphthalene compound and benzyl alcohol in the presence of an acid catalyst to obtain a benzyl-modified naphthalene compound (this step may be abbreviated as "step 1" hereinafter) and a step of subsequently reacting the obtained benzyl-modified naphthalene compound, aromatic dicarboxylic acid chloride, and a monohydric phenolic compound (this step may be abbreviated as "step 2" hereinafter).

That is, the dihydroxynaphthalene compound and benzyl alcohol are first reacted in the presence of the acid catalyst in step 1, and a benzyl-modified naphthalene compound with a structure having a naphthylene structure as the main skeleton and having phenolic hydroxyl groups in both ends thereof with benzyl groups bound onto the aromatic nucleus of the naphthylene structure in the shape of a pendant can be obtained thereby. Here, it is remarkable that when a dihydroxynaphthalene compound is naphthylene-etherified in the presence of an acid catalyst, it is generally very difficult to adjust the molecular weight, the resultant compound has a high molecular weight, and meanwhile, the above-mentioned production method enables suppressing such an increase in molecular weight and obtaining a resin suitable for electronic materials by the combined use of benzyl alcohol.

Furthermore, the adjustment of the amount of benzyl alcohol used enables adjusting the content of benzyl groups in the benzyl-modified naphthalene compound of interest and adjusting the melt viscosity itself of the benzyl-modified naphthalene compound in addition. That is, the reaction ratio of the dihydroxynaphthalene compound to benzyl alcohol can usually be selected from the range that the reaction molar ratio of the dihydroxynaphthalene compound to benzyl alcohol, namely (dihydroxynaphthalene compound)/(benzyl alcohol), is 1/0.1 to 1/10. However, the reaction molar ratio of the dihydroxynaphthalene compound to benzyl alcohol, namely (dihydroxynaphthalene compound)/(benzyl alcohol), is preferably in the range of 1/0.5 to 1/4.0 from the viewpoint of the balance among heat resistance, fire retardancy, the dielectric property, and thermal decomposition resistance.

Examples of the dihydroxynaphthalene compound which can be used here include 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, and 2,7-dihydroxynaphthalene. Among these, 1,6-dihydroxynaphthalene or 2,7-dihydroxynaphthalene is preferable, and 2,7-dihydroxynaphthalene is more preferable from the viewpoint that the fire retardancy of the cured product of the obtained benzyl-modified naphthalene compound is still better, the dielectric loss tangent of the cured product also decrease, and the dielectric property is good.

Examples of the acid catalyst which can be used in the reaction of the dihydroxynaphthalene compound and benzyl alcohol in the step 1 include inorganic acids such as phosphoric acid, sulfuric acid, and hydrochloric acid; organic acids such as oxalic acid, benzenesulfonic acid, toluenesulfonic acid, methanesulfonic acid, and fluoromethanesulfonic acid; and Friedel-Crafts catalysts such as aluminum chloride, zinc chloride, stannic chloride, ferric chloride, and diethyl sulfate.

Although the amount of the above-mentioned acid catalyst used can be appropriately selected depending on the target modification rate and the like, for example, in the case of an inorganic acid or an organic acid, the used amount is in the range of 0.001 to 5.0 parts by mass, preferably 0.01 to 3.0 parts by mass, based on 100 parts by mass of the dihydroxynaphthalene compound, and in the case of a Friedel-Crafts catalyst, the used amount is 0.2 to 3.0 mol, preferably 0.5 to 2.0 mol, based on 1 mol of the dihydroxynaphthalene compound.

The reaction of the dihydroxynaphthalene compound and benzyl alcohol in the step 1 can also be performed without a solvent, or can also be performed in a solvent from the viewpoint of enhancing the homogeneity in the reaction system. Examples of such a solvent include mono- or diethers of ethylene glycol or diethylene glycol such as ethylene glycol dimethyl ether, ethylene glycol diethyl ether, ethylene glycol dipropyl ether, diethylene glycol dimethyl ether, diethylene glycol diethyl ether, diethylene glycol dipropyl ether, ethylene glycol monomethyl ether, ethylene glycol monoethyl ether, ethylene glycol monopropyl ether, diethylene glycol monomethyl ether, diethylene glycol monoethyl ether, diethylene glycol monopropyl ether, and diethylene glycol monobutyl ether; nonpolar aromatic solvents such as benzene, toluene, and xylene; aprotic polar solvents such as dimethylformamide and dimethyl sulfoxide; and chlorobenzene.

A specific method for performing the reaction in the step 1 can be performed under the temperature condition of 60 to 180° C., preferably around 80 to 160° C. without a solvent or with the dihydroxynaphthalene compound, benzyl alcohol, and the acid catalyst dissolved in the presence of the solvent. Although the reaction time is not particularly limited, the reaction time is preferably 1 to 10 hours. Therefore, the reaction can be specifically performed by maintaining the temperature for 1 to 10 hours. It is preferable to distill off water generated in the reaction out of the system using a distilling tube or the like from the viewpoint that the reaction proceeds rapidly, and the productivity is improved.

When the obtained benzyl-modified naphthalene compound is deeply colored, to suppress it, an antioxidant or a reducing agent may be added to the reaction system. Examples of the antioxidant include hindered phenolic compounds such as a 2,6-dialkylphenol derivative; a divalent sulfur compound; and a phosphite-based compound containing a trivalent phosphorus atom. Examples of the reducing agent include hypophosphorous acid, phosphorous acid, thiosulfuric acid, sulfurous acid, hydrosulfite, or salts thereof.

After the reaction, the acid catalyst can be removed by neutralization treatment, water-washing treatment or decomposition, and a resin having phenolic hydroxyl groups of interest can be separated by common operations such as extraction and distillation. Neutralization treatment and water-washing treatment may be performed in accordance with the usual method, and for example, a basic substance such as sodium hydroxide, potassium hydroxide, sodium carbonate, ammonia, triethylenetetramine, or aniline can be used as a counteragent.

Here, specific examples of the aromatic dicarboxylic acid chloride include acid chlorides of phthalic acid, isophthalic acid, terephthalic acid, 2,6-naphthalene dicarboxylic acid, 1,6-naphthalene dicarboxylic acid, and 2,7-naphthalene dicarboxylic acid. Especially, the isophthalic acid chloride and terephthalic acid chloride are preferable from the viewpoint of the balance between solvent solubility and heat resistance.

Specific examples of the monohydric phenolic compound include phenol, cresol, p-t-butylphenol, 1-naphthol, and 2-naphthol. Especially, phenol, cresol, and 1-naphthol are preferable from the viewpoint that the reactivity with a carboxylic acid chloride is good, and 1-naphthol is further preferable from the viewpoint that the thermal decomposition resistance is good.

Here, in the method for reacting the benzyl modified naphthalene compound, the aromatic dicarboxylic acid chloride, and further the monohydric phenolic compound, these components can be specifically reacted in the presence of an alkali catalyst.

Examples of the alkali catalyst which can be used here include sodium hydroxide, potassium hydroxide, triethylamine, and pyridine. Among these, especially sodium hydroxide and potassium hydroxide are preferable from the viewpoint that sodium hydroxide and potassium hydroxide can be used in the state of aqueous solution, and the productivity is good.

In the reaction, the components can be specifically mixed and reacted in the presence of an organic solvent while the alkali catalyst or its aqueous solution is dropped continuously or intermittently. In that case, the concentration of the aqueous solution of the alkali catalyst is preferably in the range of 3.0 to 30% by mass. Examples of the organic solvent which can be used here include toluene, dichloromethane, and chloroform.

When the aqueous solution of the alkali catalyst is used, after the reaction, the reaction liquid is left to stand and separated into liquids, the aqueous layer is removed, the procedure is repeated until the aqueous layer after the residual organic layer is washed is almost neutral, and a resin of interest can be obtained.

When the thus obtained compound having an active ester group of (B2) has a softening point of 100 to 200° C., the solubility in the organic solvent preferably increases.

As long as an effect of the present invention is not deteriorated, the thermosetting resin composition of the present invention may contain a curing agent other than (B) the compound having an active ester group. Examples thereof include compounds having phenolic hydroxyl groups, polycarboxylic acids and acid anhydrides thereof, compounds having cyanate ester groups, compounds having maleimide groups, and alicyclic olefin polymers.

[(C) Inorganic Filler]

The curable resin composition of the present invention contains (C) the inorganic filler. Incorporating (C) the inorganic filler enables suppressing the cure shrinkage of the obtained cured product and improving adhesion, hardness, and heat characteristics such as crack resistance obtained in combination with the heat strength of a conductor layer such as copper around an insulating layer, and the curable resin composition has a lower CTE. Known inorganic fillers can be used as (C) the inorganic filler, and are not limited to specific inorganic fillers. Examples of the inorganic filler include barium sulfate; barium titanate; silica such as amorphous silica, crystalline silica, molten silica and spherical silica; extenders such as talc, clay, Neuburg siliceous earth particles, boehmite, magnesium carbonate, calcium carbonate, titanium oxide, aluminum oxide, aluminum hydroxide, silicon nitride, aluminum nitride, and calcium zirconate; and metal powders such as copper, tin, zinc, nickel, silver, palladium, aluminum, iron, cobalt, gold, and platinum. (C) The inorganic filler is preferably spherical particles. Especially silica is preferable, and enables suppressing the cure shrinkage of the cured product of the curable resin composition and improving characteristics such as adhesion and hardness, and the cured product has a lower CTE. The average particle size (median diameter, D50) of (C) the inorganic filler is preferably 0.01 to 10 µm (C) The inorganic filler is preferably silica having an average particle size of 0.01 to 3 µm. The average particle size of (C) the inorganic filler herein is an average particle size in view of not only the particle sizes of primary particles but also the particle sizes of secondary particles (aggregates). The average particle size can be determined with a laser diffraction type particle size distribution measuring device. Examples of the distribution measuring device by laser diffraction include Microtrac MT3000II manufactured by MicrotracBEL Corp.

(C) The inorganic filler is preferably a surface-treated inorganic filler. As the surface treatment, surface treatment with a coupling agent or surface treatment such as alumina treatment by which organic groups are not introduced may be performed. The method for surface-treating (C) an inorganic filler is not particularly limited. A well-known method for common use may be used. (C) The inorganic filler may be surface-treated with a surface treatment agent having curable reactive groups, for example, a coupling agent having curable reactive groups, or the like.

The surface treatment of (C) the inorganic filler is preferably surface treatment with the coupling agent. As the coupling agent, a coupling agent such as a silane coupling agent, a titanate coupling agent, an aluminate coupling agent, or a zircoaluminate coupling agent can be used. Especially the silane coupling agent is preferable. Examples of such a silane coupling agent include vinyltrimethoxysilane, vinyltriethoxysilane, N-(2-aminomethyl)-3-aminopropylmethyldimethoxysilane, N-(2-aminoethyl)-3-aminopropyltrimethoxysilane, 3-aminopropyltriethoxysilane, 3-anilinopropyltrimethoxysilane, 3-glycidoxypropyltrimethoxysilane, 3-glycidoxypropylmethyldimethoxysilane, 2-(3,4-epoxycyclohexyl)ethyltrimethoxysilane, 3-methacryloxypropyltrimethoxysilane, 3-mercaptopropyltrimethoxysilane, and N-phenyl-3-aminopropyltrimethoxysilane. These can be used alone or in combination. These silane coupling agents are preferably adsorbed or immobilized by reaction on the surface of the inorganic filler beforehand. Here, the amount of the coupling agent used for treatment is, for example, 0.1 to 10 parts by mass, preferably 0.5 to 10 parts by mass, based on 100 parts by mass of the inorganic filler.

As the curable reactive group, thermosetting reactive groups are preferable. Examples of the thermosetting reactive groups include hydroxyl group, carboxyl group, isocyanate group, amino group, imino group, epoxy group, oxetanyl group, mercapto group, methoxymethyl group, methoxyethyl group, ethoxymethyl group, ethoxyethyl group, and oxazoline group. Especially at least one of an amino group and an epoxy group is preferable. The surface-treated inorganic filler may have photocurable reactive groups besides the thermosetting reactive groups.

The surface-treated inorganic filler may be contained in a resin layer obtained from the curable resin composition with the surface treated. Although the inorganic filler and the surface treatment agent are separately blended in a curable resin composition forming the resin layer, and the inorganic filler may be surface-treated in the composition, it is preferable to blend an inorganic filler surface-treated beforehand. Blending the inorganic filler surface-treated beforehand enables preventing a decrease in crack resistance and the like due to a surface treatment agent which can remain and is not consumed by surface treatment in the case of separate blending. When the inorganic filler is surface-treated beforehand, it is preferable to blend a predispersion in which the inorganic filler is predispersed in a solvent or a curable resin, and it is more preferable to predisperse the surface-treated inorganic filler in a solvent and blend the predispersion in the composition or to fully surface-treat a surface-untreated inorganic filler when the surface-untreated inorganic filler is predispersed in a solvent and then blend the predispersion in the composition.

(C) The inorganic filler in the state of powder or a solid may be blended with an epoxy resin or the like, or may be mixed with a solvent or a dispersant to prepare slurry, which may be then blended with an epoxy resin or the like.

(C) The inorganic filler may be used alone or as a mixture of two or more. When the solid content in the resin composition is 100% by mass, the amount of (C) the inorganic filler blended is preferably 50% by mass or more, more preferably 60% by mass or more, and further preferably 65% by mass or more from the viewpoint of a decrease in the CTE. The amount of (C) the inorganic filler blended is preferably 90% by mass or less, more preferably 80% by mass or less, and particularly preferably 75% by mass or less from the viewpoint of the toughness of the cured film.

The solid content in the resin composition herein means components except the organic solvent.

[Thermoplastic Resin]

The curable resin composition of the present invention can further contain a thermoplastic resin to improve the mechanical strength of the obtained cured film. The thermoplastic resin is preferably soluble in the solvent. When the thermoplastic resin is soluble in the solvent, the pliability is improved at the time of forming the dry film, and the occurrence of cracks and powder falling can be suppressed. Examples of the thermoplastic resin include thermoplastic polyhydroxypolyether resins, phenoxy resins which are condensates of epichlorohydrin and various Bifunctional phenol compounds or phenoxy resins obtained by esterifying hydroxyl groups of hydroxy ether moieties existing in the skeletons thereof with various acid anhydrides or acid chlorides, polyvinyl acetal resins, polyamide resins, polyamide imide resins, and block copolymers. The thermoplastic resin can be used alone or in combination of two or more. Since the glass transition temperature can be improved with the dielectric loss tangent maintained low, the phenoxy resins are preferable among these thermoplastic resins Polyvinyl acetal resins are obtained, for example, by acetalizing a polyvinyl alcohol resin with an aldehyde. The aldehyde used for this is not particularly limited. Examples thereof include formaldehyde, acetaldehyde, propionaldehyde, butylaldehyde, amylaldehyde, hexylaldehyde, heptylaldehyde, 2-ethylhexylaldehyde, cyclohexylaldehyde, furfural, benzaldehyde, 2-methylbenzaldehyde, 3-methylbenzaldehyde, 4-methylbenzaldehyde, p-hydroxybenzaldehyde, m-hydroxybenzaldehyde, phenylacetaldehyde, and β-phenylpropionaldehyde, and butylaldehyde is preferable.

Specific examples of the phenoxy resins include FX280S and FX293 manufactured by Tohto Kasei Co., Ltd.; and jER® YX8100BH30, jER® YX6954BH30, YL6954, YL6974, and jER® YX7200B35 manufactured by Mitsubishi Chemical Corporation. Specific examples of the polyvinyl acetal resins include the S-LEC KS series manufactured by SEKISUI CHEMICAL CO., LTD. Examples of the polyamide resins include the KS5000 series manufactured by Hitachi Chemical Co., Ltd. and the BP series manufactured by Nippon Kayaku Co., Ltd. Furthermore, examples of the polyamide imide resins include the KS9000 series manufactured by Hitachi Chemical Co., Ltd.

When the total amount of (A) the epoxy resin and (B) the compound having an active ester group in the resin composition is 100% by mass, the amount of the thermoplastic resin blended is preferably 0.1% by mass or more and more preferably 0.3% by mass or more from the viewpoint of the mechanical strength of the obtained cured film. The amount blended is preferably 20% by mass or less and more preferably 15% by mass or less from the viewpoint of the dielectric property of the cured film.

The polyvinyl acetal resin is preferable from the viewpoint of reducing the surface roughness of the cured product after desmear.

[Curing Accelerator]

The curable resin composition of the present invention can contain a curing accelerator. The curing accelerator promotes thermosetting reaction, and is used to further improve characteristics such as adhesion, chemical resistance, and heat resistance.

In the present invention, the curing accelerator can be used to mainly promote the reaction of (A) the epoxy resin and (B) the compound having an active ester group.

Specific examples of the curing accelerator of the curing reaction of (A) the epoxy resin and (B) the compound having an active ester group include known curing accelerators such as imidazole and its derivative; guanamines such as acetoguanamine and benzoguanamine; polyamines such as diaminodiphenylmethane, m-phenylenediamine, m-xylenediamine, diaminodiphenylsulfone, dicyandiamide, urea, urea derivatives, melamine, and polybasic hydrazides; the organic acid salts and/or the epoxy adducts of these; the amine complexes of boron trifluoride; triazine derivatives such as ethyldiamino-S-triazine, 2,4-diamino-S-triazine, and 2,4-diamino-6-xylyl-S-triazine; amines such as trimethylamine, triethanolamine, N,N-dimethyloctylamine, N-benzyldimethylamine, pyridine, dimethylaminopyridine, N-methylmorpholine, hexa(N-methyl)melamine, 2,4,6-tris (dimethylaminophenol), tetramethylguanidine, and m-aminophenol; polyphenols such as polyvinyl phenol, polyvinyl phenol bromide, phenol novolac, and alkylphenol novolac; organic phosphines such as tributylphosphine, triphenylphosphine, and tris-2-cyanoethyl phosphine; phosphonium salts such as tri-n-butyl(2,5-dihydroxyphenyl)phosphonium bromide and hexadecyltributylphosphonium chloride; quaternary ammonium salts such as benzyltrimethylammonium chloride, and phenyltributylammonium chloride; the afore-mentioned polybasic acid anhydrides; photo-cation polymerization catalysts such as diphenyliodonium tetrafluoroboronate, triphenylsulfonium hexafluoroantimonate, and 2,4,6-triphenylthiopyrylium hexafluorophosphate; styrene-maleic anhydride resins; the equimolar reaction products of phenyl isocyanate and dimethylamine; the equimolar reaction products of dimethylamine and an organic polyisocyanate such as tolylene diisocyanate or isophorone diisocyanate; and metal catalysts. Among curing accelerators, imidazole, its derivative, and dimethylaminopyridine are preferable. Since a cured product having higher Tg and a lower dielectric loss tangent is obtained, dimethylaminopyridine is more preferable.

The curing accelerator can be used alone or in combination of two or more. When the curing accelerator is blended in the curable resin composition of the present invention, its amount blended is preferably 5% by mass or less and more preferably 3% by mass or less from the viewpoint of the storage stability of the resin composition before thermosetting reaction, and is preferably 0.01% by mass or more and more preferably 0.1% by mass or more from the viewpoint of curability based on 100% by mass of the total solid content amount of the A and B components.

[Rubber-Like Particles]

The curable resin composition can contain rubber-like particles if needed. Examples of such rubber-like particles include polybutadiene rubber, polyisopropylene rubber, urethane-modified polybutadiene rubber, epoxy-modified polybutadiene rubber, acrylonitrile modified polybutadiene rubber, carboxyl group-modified polybutadiene rubber, acrylonitrile-butadiene rubber modified with carboxyl groups or hydroxyl groups, crosslinked rubber particles thereof, and core-shell type rubber particles. Such rubber-like particles can be used alone or in combination of two or more. These rubber-like particles improve the pliability of the obtained cured film or crack resistance or enables surface roughening treatment with an oxidizer, and the rubber-like particles are added to improve adhesion strength to copper foil or the like.

The average particle size of the rubber-like particles is preferably in the range of 0.005 to 1 μm, and more preferably in the range of 0.2 to 1 μm. The average particle size of the rubber-like particles in the present invention can be determined with a laser diffraction type particle size distribution measuring device. For example, the rubber-like particles are uniformly dispersed in a suitable organic solvent by ultrasonic waves or the like, the particle size distribution of the rubber-like particles can be produced based on mass using a Nanotrac wave by MicrotracBEL Corp., and the average particle size of the rubber-like particles can be measured by defining its median diameter as an average particle size.

[Fire Retardant]

The curable resin composition of the present invention can contain a fire retardant. As the fire retardant, a hydrated metal-based fire retardant such as aluminum hydroxide or magnesium hydroxide, red phosphorus, ammonium phosphate, ammonium carbonate, zinc borate, zinc stannate, a molybdenum compound-based fire retardant, a bromine compound-based fire retardant, a chlorine compound-based fire retardant, a phosphoric acid ester, a phosphorus-containing polyol, a phosphorus-containing amine, melamine cyanurate, a melamine compound, a triazine compound, a guanidine compound, a silicon polymer, or the like can be used. Fire retardants can be used alone or in combination of two or more.

[Organic Solvent]

Although the organic solvent is not particularly limited, examples thereof include ketones, aromatic hydrocarbons, glycol ethers, glycol ether acetates, esters, alcohols, aliphatic hydrocarbons, and petroleum solvents. More specific examples thereof include N,N-dimethylformamide (DMF), tetrachloroethylene, and turpentine besides ketones such as methyl ethyl ketone, cyclohexanone, methyl butyl ketone, and methyl isobutyl ketone; aromatic hydrocarbons such as toluene, xylene, and tetramethylbenzene; glycol ethers such as Cellosolve, Methyl Cellosolve, butyl Cellosolve, Carbitol, methyl Carbitol, butyl Carbitol, ethylene glycol monomethyl ether, ethylene glycol monoethyl ether, ethylene glycol monobutyl ether, propylene glycol monomethyl ether, dipropylene glycol monomethyl ether, dipropylene glycol diethyl ether, and triethylene glycol monoethyl ether; esters such as ethyl acetate, butyl acetate, isobutyl acetate, ethylene glycol monoethyl ether acetate, dipropylene glycol methyl ether acetate, propylene glycol methyl ether acetate, propylene glycol ethyl ether acetate and propylene glycol butyl ether acetate; alcohols such as ethanol, propanol, 2-methoxy propanol, n-butanol, isobutyl alcohol, isopentyl alcohol, ethylene glycol, and propylene glycol; aliphatic hydrocarbons such as octane and decane; petroleum solvents such as petroleum ether, petroleum naphtha, hydrogenated petroleum naphtha, and solvent naphtha; and the like. An organic solvent such as Swasol 1000 or Swasol 1500 by manufactured by Maruzen Petrochemical Co., Ltd.; Solvent #100 or Solvent #150 manufactured by SANKYO CHEMICAL CO., LTD.; Shellsol A100 or Shellsol A150 manufactured by Shell Chemicals Japan Ltd.; or IPSol 100 or IPSol 150 manufactured by Idemitsu Kosan Co., Ltd. may be used. The organic solvent can be used alone or in combination of two or more.

When the dry film is formed, the amount of the residual solvent in the resin layer is preferably 0.1 to 10.0% by mass. When the amount of the residual solvent is 10.0% by mass or less, bumping at the time of thermosetting is controlled, and the flatness of the surface is better. The flow of the resin due to an excessive decrease in melt viscosity can be suppressed, and the flatness is good. When the amount of the residual solvent is 0.1% by mass or more, especially 0.5% by mass or more, the fluidity at the time of lamination is good, and the flatness and the embedding property is better.

[Other Components]

Silicon powder, fluoride powder, an organic filler such as nylon powder, a known colorant such as phthalocyanine blue, phthalocyanine green, iodine green, disazo yellow, crystal violet, titanium oxide, carbon black, or naphthalene black; a known thickener such as asbestos, orben, benton, or fine powder silica, an antifoaming agent and/or a leveling agent such as a silicone-based antifoaming agent and/or leveling agent, a fluorine-based antifoaming agent and/or leveling agent, or a polymer-based antifoaming agent and/or leveling agent, an adhesion-imparting agent such as a thiazole-based adhesion-imparting agent, a triazole-based adhesion-imparting agent, or a silane coupling agent; and a known additive such as a titanate-based additive, or an aluminum-based additive can be further used for the curable resin composition of the present invention if needed.

The curable resin composition of the present invention may be used as a dry film, or may be used as a liquid. When the curable resin composition is used as a liquid, the curable resin composition may be a 1-component or a 2 or more-component curable resin composition, and is preferably a 2 or more-component curable resin composition from the viewpoint of storage stability.

<Dry Film>

The dry film of the present invention can be manufactured by applying the curable resin composition of the present invention onto a carrier film, drying the curable resin composition and forming a resin layer as a dry coating film. A protective film can be laminated on the resin layer if needed.

The carrier film serves as a support for the resin layer of the dry film, and a film to which the curable resin composition is applied when the resin layer is formed. As the carrier film, for example, a polyester film of polyethylene terephthalate, polyethylene naphthalate, or the like; a film such as a polyimide film, a polyamide-imide film, a polyethylene film, a polytetrafluoroethylene film, a polypropylene film, or a polystyrene film comprising a thermoplastic resin; surface-treated paper; or the like can be used. Among these, the polyester film can be appropriately used from the viewpoints of heat resistance, mechanical strength, handleability, and the like. Although the thickness of the carrier film is not particularly limited, the thickness is appropriately selected from the range of around 10 to 150 μm depending on use. The surface of the carrier film provided with the resin layer may be subjected to mold release treatment. A film formed by sputtering or copper foil may be formed on the surface of the carrier film provided with the resin layer.

The protective film is provided on the opposite surface of the resin layer to the carrier film to prevent dust and the like from attaching to the surface of the resin layer of a dry film and improve the handleability. Although, for example, the film comprising the thermoplastic resin and illustrated for the carrier film, the surface-treated paper, or the like can be used as the protective film, the polyester film, the polyethylene film, and the polypropylene film are preferable among these. Although the thickness of the protective film is not particularly limited, the thickness is appropriately selected from the range of around 10 to 150 μni depending on use. The surface of the protective film provided with the resin layer may be subjected to mold release treatment.

<Resin-Clad Copper Foil>

The copper foil with the resin of the present invention has a resin layer obtained by applying the curable resin composition of the present invention to the copper foil surface of the copper foil or the copper foil with the carrier and drying the composition.

[Copper Foil with Carrier]

The copper foil with the carrier may have a configuration comprising carrier foil and copper foil sequentially, and the resin layer comprising the curable resin composition of the present invention may be layered so as to be in contact with the copper foil. It is preferable to use ultrathin copper foil as the copper foil.

Examples of the carrier foil include copper foil, aluminum foil, stainless steel (SUS) foil, and resin films wherein the surface is coated with a metal, and the carrier foil is preferably copper foil. The copper foil may be electrolytic copper foil or rolled copper foil. The thickness of the carrier foil is usually 250 μm or less, and is preferably 9 to 200 μm. A release layer may be formed between the carrier foil and the copper foil if needed.

Although the method for forming copper foil is not particularly limited, the copper foil is preferably formed into ultrathin copper foil, and can be formed by a wet method for forming a film such as electroless copper plating or electrolytic copper plating; a dry method for forming a film such as sputtering or chemical vapor deposition; or a combination thereof. The thickness of the ultrathin copper foil is preferably 0.1 to 7.0 μm, more preferably 0.5 to 5.0 μm, and further preferably 1.0 to 3.0 μm.

<Cured Product>

The cured product of the present invention is obtained by curing the curable resin composition of the present invention, the resin layer of the dry film of the present invention, or the resin layer of the copper foil with the resin of the present invention.

The method for curing is not particularly limited, the curable resin composition may be cured by a known method, and may be cured, for example, by heating the composition at 150 to 230° C. As a method for manufacturing a printed circuit board using the curable resin composition, for example, in the case of a dry film having a three-layer structure in which the resin layer is between the carrier film and the protective film, a printed circuit board can be manufactured by the following method. Either the carrier film or the protective film is exfoliated from the dry film, the residual layers are heated to laminate on a circuit board on which a circuit pattern was formed, and the resin layer is thermoset. The resin layer may be cured in an oven or with a hot plate press for thermosetting. When a substrate on which the circuit was formed and the dry film of the present invention are laminated or hot plate-pressed, copper foil or a substrate on which the circuit is formed can also be laminated simultaneously. A pattern and via holes can be formed by laser radiation or with a drill at positions corresponding to predetermined positions on the board on which the circuit pattern is formed, and the printed circuit board can be manufactured by exposing circuit wiring. In this case, desmear treatment is performed when components which cannot be completely removed on the circuit wiring in the pattern or the via holes, and remain (smears) exist. The residual film among the carrier film and the protective film may be exfoliated after any of lamination, thermosetting, laser processing, and desmear treatment.

When a printed circuit board is manufactured using the copper foil with the resin of the present invention, the resin layer may be layered on the circuit board on which the circuit pattern is formed, the copper foil may be formed into a part or all of a wiring layer, a circuit may be formed by a modified semi-additive process (MSAP), and a buildup wiring board may be manufactured. A buildup wiring board on which copper foil is removed, and a circuit is formed by a semi-additive process (SAP) may be manufactured. A printed circuit board may be manufactured by direct buildup on wafer, in which the lamination of resin-clad copper foils and the formation of circuits are alternately repeated on a semiconductor integrated circuit. A coreless buildup method, in which resin layers and conductor layers are alternately formed without using a core board, may be used.

<Electronic Component>

An electronic component of the present invention has the cured product of the present invention, namely the cured product of the curable resin composition of the present invention, the resin layer of the dry film of the present invention, or the resin layer of the copper foil with the resin of the present invention.

Examples of the electronic component include a permanent protective film for printed circuit boards, especially include a solder resist layer, an insulating layer between layers, and a cover lay for flexible printed circuit boards. The electronic component also include passive components for uses other than printed circuit boards such as inductors.

The curable resin composition of the present invention can be appropriately used also for permanent hole filling of a printed circuit board, for example, hole filling of through holes, via holes, or the like, besides the above-mentioned uses. The curable resin composition can be used also as sealing materials, copper-clad laminates (CCLs), or pre-preg for semiconductor chips.

Since the cured product of the curable resin composition of the present invention is excellent in the dielectric property, the use of this improves the transmission quality also for uses at high frequencies. Specific examples of the application at high frequencies include millimeter-wave radars for automatic driving; boards for millimeter-wave sensors; mother boards for mobiles capable of supporting high-speed communication and SLPs on which circuits are formed by a modified semi-additive process (MSAP) (substrate-like PCBs); application processors (AP) for mobiles and personal computers; servers for base stations and high multilayer boards for routers; and boards for antennas and semiconductor sealing materials.

A wiring board may be formed by pasting wiring together using the dry film of the present invention.

The form of a material for forming circuits using the curable resin composition of the present invention may be the copper foil with the resin (RCC: resin-coated copper) designed for a modified semi-additive process (MSAP) or a buildup film designed for a semi-additive process (SAP).

Although the dielectric loss tangent of the cured product of the present invention is not particularly limited, according to the present invention, a cured product having a low dielectric loss tangent can be obtained, for example, the dielectric loss tangent can also be reduced to 0.003 or less, further reduced to 0.002 or less, and further reduced to 0.001 or less at a frequency of 10 GHz and 23° C.

EXAMPLES

Although the present invention will be described specifically hereinafter by showing the Examples, the present invention is not limited to only these Examples. Unless otherwise specified below, "part" and "%" mean part by mass and % by mass, respectively.

(Synthesis of (B) Compound Having Active Ester Group)

Synthesis Example 1

A flask equipped with a thermometer, a dropping funnel, a cooling tube, a distilling tube, and a stirrer was charged with 203.0 g of isophthalic acid chloride (molar number of acid chloride groups: 2.0 mol) and 1338 g of toluene. Isophthalic acid chloride was dissolved in the system wherein air was replaced with nitrogen under a reduced pressure. Subsequently, the flask was charged with 96.0 g (0.67 mol) of α-naphthol and 220 g of a dicyclopentadiene phenol resin (molar number of phenolic hydroxyl groups: 1.33 mol). α-naphthol and dicyclopentadiene phenol resin were dissolved in the system wherein air was replaced with nitrogen under a reduced pressure. Then, 1.12. g of tetrabutylammmonium bromide was dissolved in the system. While nitrogen gas purge was performed, the temperature in the system was controlled to be 60° C. or less, and 400 g of a 20% sodium hydroxide aqueous solution was dropped for 3 hours. Subsequently, stirring was continued under the above-mentioned conditions for 1.0 hour. After the reaction, the mixture was left to stand and separated into liquids, and the aqueous layer was removed. Water was further fed to the toluene phase in which the reactant was dissolved, the mixture was stirred and mixed for around 15 minutes, the mixture was left to stand and separated into liquids, and the aqueous layer was removed. This operation was repeated until the pH of the aqueous layer was 7. Then, moisture was removed by decanter dehydration to obtain a solution of a compound having an active ester group (B-1) in toluene at a solid content of 65%.

The ester group equivalent of the obtained compound having an active ester group (B-1) in terms of the solid content was 223 g/mol.

Synthesis Example 2

A flask equipped with a thermometer, a dropping funnel, a cooling tube, a distilling tube, and a stirrer was charged with 320 g (2.0 mol) of 2,7-dihydroxynaphthalene, 184 g (1.7 mol) of benzyl alcohol, 5.0 g para-toluene sulfonic acid monohydrate, and the mixture was stirred at room temperature while nitrogen was blown in. Then, the temperature was raised to 150° C. The mixture was stirred for 4 hours while the generated water was distilled off out of the system. After the reaction, 900 g of methyl isobutyl ketone and 5.4 g of a 20% sodium hydroxide aqueous solution was added for neutralization. The aqueous layer was then removed by liquid separation, the reaction mixture was washed with 280 g of water 3 times, and methyl isobutyl ketone was removed under a reduced pressure to obtain 460 g of a benzyl-modified naphthalene compound (B-2 intermediate). The obtained benzyl-modified naphthalene compound (B-2 intermediate) was a black solid, and the hydroxyl group equivalent was 180 g/Eq.

Subsequently, another flask, to which a thermometer, a dropping funnel, a cooling tube, a distilling tube, and a stirrer were attached, was charged with 203.0 g of isophthalic acid chloride (molar number of acid chloride groups: 2.0 mol) and 1400 g of toluene. Isophthalic acid chloride was dissolved in the system wherein air was replaced with nitrogen under a reduced pressure. Subsequently, the flask was charged with 96.0 g (0.67 mol) of α-naphthol and 240 g of the benzyl-modified naphthalene compound (molar number of phenolic hydroxyl groups: 1.33 mol) (B-2 intermediate). α-naphthol and benzyl-modified were dissolved in the system wherein air was replaced with nitrogen under a reduced pressure. Then, 0.70 g of tetrabutylammonium bromide was dissolved in the system. While nitrogen gas purge was performed, the temperature in the system was controlled to be 60° C. or less, and 400 g of a 20% sodium hydroxide aqueous solution was dropped for 3 hours. Subsequently, stirring was continued under the above-mentioned conditions for 1.0 hour. After the reaction, the mixture was left to stand and separated into liquids, and the aqueous layer was removed. Water was further fed to the toluene layer in which the reactant was dissolved therein, the mixture was stirred and mixed for around 15 minutes, the mixture was left to stand and separated into liquids, and the aqueous layer was removed. This operation was repeated until the pH of the aqueous layer was 7. Then, moisture was removed by decanter dehydration to obtain a solution of a compound having an active ester group (B-2) in toluene at a solid content of 65%. The ester group equivalent of the obtained compound having an active ester group (B-2) in terms of the solid content was 230 g/mol.

<1. Preparation of Curable Resin Composition>

Various components shown in the following Tables 1 to 4 were kneaded and mixed at ratios (part by mass) shown in Tables 1 to 4, respectively to prepare the curable resin compositions of the Examples 1 to 44 and the Comparative Examples 1 to 4 for producing films after curing. The numerical values in the Tables show part by mass or % by mass (in terms of the solid contents).

As to the curable resin compositions, as shown below, samples for tests were produced, the glass transition temperatures (Tg), the coefficients of linear thermal expansion (CTEs) (α1)), and the dielectric loss tangents were measured and evaluated. Tables 1 to 4 show the results.

<2. Production of Films after Curing>

Each of the curable resin compositions of the Examples and the Comparative Examples was applied onto the glossy surface of copper foil (F2-WS manufactured by Furukawa Electric Co., Ltd., 18 μm in thickness) using a film applicator, dried in a hot air circulation drying furnace at 90° C. for 10 minutes and successively cured at 200° C. for 60 minutes. The copper foil was then exfoliated to produce the films after curing (cured films) of the Examples 1 to 44 and the Comparative Examples 1 to 4 each having a thickness of 40 μm.

<3. Measurement of Glass Transition Temperature (Tg) and Coefficient of Linear Thermal Expansion (CTE (α1))>

Each of the samples obtained in the <2. Production of films after curing> was cut out to a measurement size (size of 3 mm×10 mm), and the glass transition temperature (Tg) and the coefficient of linear thermal expansion (CTE (α1)) were measured using TMA Q400EM manufactured by TA Instruments Japan Inc. The temperature was raised at a rate of temperature increase of 10° C./minute from room temperature, measurement was successively performed twice, and the glass transition temperature (Tg), which was an intersection point of two different tangent lines of the coefficient of linear thermal expansion in the second measurement, and the coefficient of linear thermal expansion (CTE (α1)) from 30° C. to 100° C. were evaluated. The coefficients of linear thermal expansion (CTE (α1)) were measured as to only Examples 1 to 30 and Comparative Examples 1 and 2.

The glass transition temperatures (Tg) were measured as to all the Examples and the Comparative Examples. Measured values were listed in only Tables 1 to 3 (Examples 1 to 30 and Comparative Examples 1 and 2) (Tables 1 to 3). Furthermore, different standards as follows were used for the evaluation of the glass transition temperatures depending on Examples.

[Evaluation Standard of Glass Transition Temperatures of Examples 1 to 30 and Comparative Examples 1 and 2 (Measurement Results in Tables 1 to 3)]
 ⊚: 180° C. or more
 ○: 170° C. or more and less than 180° C.
 x: less than 170° C.
 *: Not measured due to the insufficient strength of the fragile cured product obtained.

[Evaluation standard of glass transition temperatures of Examples 31 to 44 and Comparative Examples 3 and 4 (measurement results in Table 4)]
 ⊚: 175° C. or more
 ○: 170° C. or more and less than 175° C.
 x: less than 170° C.
 *: Not measured due to the insufficient strength of the fragile cured product obtained.

<4. Measurement of Dielectric Loss Tanuent (Df)>

Each of the samples obtained in the <Production of films after curing> was cut out to a measurement size (size of 50 mm×60 mm), and the dielectric loss tangent at 23° C. and 10 GHz was measured using an SPDR dielectric resonator and a network analyzer (both manufactured by Agilent Technologies Japan, Ltd.). As to Examples 1 to 30 and Comparative Examples 1 and 2, the measured values were shown in Tables 1 to 3. As to Example 31 to 44 and Comparative Example to 3 to 4, the evaluation results according to the following standard were shown in Table 4.
 ⊚: less than 0.003
 ○: 0.003 or more and less than 0.005
 x: 0.005 or more
 *: Not measured due to the insufficient strength of the fragile cured product obtained.

Furthermore, the peel strengths were evaluated as to the samples of Examples 31 to 44 and Comparative Examples 3 to 4.

<5. Production of Samples for Peel Strength Measurement>

(1) Roughening Treatment of Laminate Sheet

Both sides of a glass fabric base epoxy resin double-sided copper-clad laminate [thickness of copper foil 18 μm, thickness of board 0.3 mm, R5715ES manufactured by Panasonic Corporation] in which an inner layer circuit was formed were immersed in CZ8100 manufactured by MEC COMPANY LTD., and the copper surfaces were subjected to roughing treatment (etching amount: around 1 μm).

(2) Production of Resin-Clad Copper Foil

The curable resin composition of each of Examples and Comparative Examples was applied onto the ultrathin copper foil surface of ultrathin copper foil with a carrier (MT18Ex manufactured by MITSUI MINING & SMELTING CO., LTD., ultrathin copper having a thickness of 3 μm) using a film applicator and dried in a hot air circulation drying furnace at 90° C. for 10 minutes to obtain a resin-clad copper foil in which the thickness of the resin layer was around 40 μm.

(3) Lamination of Resin-Clad Copper Foil

The resin composition-coated surfaces of the copper foils with the resins (2) were laminated to both sides of the laminate sheet subjected to roughening treatment (1) using a batch type vacuum pressurizing laminator IVIVLP-500 (manufactured by MEIKI CO LTD.). The lamination was performed by reducing the pressure for 30 seconds, setting the pressure to 13 hPa or less and then performing pressing for 30 seconds at 80° C. and a pressure of 0.5 MPa.

(4) Curing of Resin Composition

The laminate sheet (3) to which the copper foils with the resins were laminated was cured in the hot air circulation drying furnace at 170° C. for 30 minutes.

(5) Electrolytic Copper Plating

The carrier copper foils were exfoliated from both sides of the laminate sheet after curing, and the ultrathin copper foils on both sides (3 μm) was increased to a thickness of around 25 μm by electrolytic copper plating.

(6) Annealing Treatment

The laminate sheet after electrolytic copper plating was annealing-treated in the hot air circulation drying furnace at 200° C. for 60 minutes.

<Measurement of Peel Strength>

The peel strength was measured according to JIS C6481 using the sample produced by the method and evaluated according to the following standard. Table 4 shows the results.

⊚: 0.5 kN/m or more
○: 0.4 kN/m or more and less than 0.5 kN/m
x: Less than 0.4 kN/m
*: Not measured due to the insufficient strength of the fragile cured product obtained.

TABLE 1

| Components blended | | Example | | | | | | |
|---|---|---|---|---|---|---|---|---|
| (parts by mass in terms of solid content) | | 1 | 2 | 3 | 4 | 5 | 6 | 7 |
| (A) Epoxy resin | EPICLON(R) EXA-835LV | 20 | 20 | 20 | 20 | 20 | — | — |
| | TEPIC(R)-VL | — | — | — | — | — | 20 | 20 |
| | jER(R) 630 | — | — | — | — | — | — | — |
| | jER(R) 604 | — | — | — | — | — | — | — |
| | NC-3000H | 80 | 80 | 80 | 80 | 80 | 80 | 80 |
| | ESN-475V | — | — | — | — | — | — | — |
| (B) Compound having active ester group | B-1 (Synthesis Example 1) | 443 | 221 | 148 | 148 | 148 | 161 | 161 |
| | B-2 (Synthesis Example 2) | — | — | — | — | — | — | — |
| (C) Inorganic filler | SO-C2 | 1266 | 750 | 578 | 578 | 578 | 608 | 608 |
| Phenoxy resin | jER(R) YX6954BH30 | — | — | — | 12 | — | 13 | — |
| | jER(R) YX7200B35 | — | — | — | — | 12 | — | — |
| Curing accelerator | Dimethylaminopyridine | 2.7 | 1.6 | 1.2 | 1.2 | 1.2 | 1.3 | 1.3 |
| Epoxy group/active ester group *1 | | 0.2 | 0.4 | 0.6 | 0.6 | 0.6 | 0.6 | 0.6 |
| Content of (C) inorganic filler based on total amount of epoxy (A), active ester (B), and (C) inorganic filler (% by mass) | | 70 | 70 | 70 | 70 | 70 | 70 | 70 |
| Content of phenoxy resin based on total amount of epoxy (A) and active ester (B) (% by mass) | | 0 | 0 | 0 | 5 | 5 | 5 | 0 |
| Content of curing accelerator based on total amount of epoxy (A) and active ester (B) (% by mass) | | 0.5 | 0.5 | 0.5 | 0.5 | 0.5 | 0.5 | 0.5 |
| Glass transition temperature (° C.) | | 171 | 175 | 178 | 184 | 183 | 185 | 182 |
| Evaluation of glass transition temperature (° C.) | | ○ | ○ | ○ | ⊚ | ⊚ | ⊚ | ⊚ |
| Dielectric loss tangent (10 GHz) | | 0.002 | 0.002 | 0.003 | 0.003 | 0.003 | 0.003 | 0.003 |
| Coefficient of linear thermal expansion (ppm) | | 19 | 19 | 20 | 20 | 21 | 20 | 20 |

| Components blended | | Example | | | | | |
|---|---|---|---|---|---|---|---|
| (parts by mass in terms of solid content) | | 8 | 9 | 10 | 11 | 12 | 13 |
| (A) Epoxy resin | EPICLON (R) EXA-835LV | — | — | — | — | — | — |
| | TEPIC (R)-VL | — | — | — | — | — | — |
| | jER (R) 630 | 20 | 20 | 20 | — | — | — |
| | jER (R) 604 | — | — | — | 20 | 20 | 20 |
| | NC-3000H | 80 | 80 | 80 | 80 | 80 | 80 |
| | ESN-475V | — | — | — | — | — | — |
| (B) Compound having active ester group | B-1 (Synthesis Example 1) | 269 | 179 | 179 | 248 | 166 | 166 |
| | B-2 (Synthesis Example 2) | — | — | — | — | — | — |
| (C) Inorganic filler | SO-C2 | 860 | 651 | 651 | 813 | 620 | 620 |
| Phenoxy resin | jER (R) YX6954BH30 | 18 | 14 | — | 17 | 13 | — |
| | jER (R) YX7200B35 | — | — | — | — | — | — |
| Curing accelerator | Dimethylaminopyridine | 1.8 | 1.4 | 1.4 | 1.7 | 1.3 | 1.3 |

TABLE 1-continued

|  |  |  |  |  |  |  |
|---|---|---|---|---|---|---|
| Epoxy group/active ester group *1 | 0.4 | 0.6 | 0.6 | 0.4 | 0.6 | 0.6 |
| Content of (C) inorganic filler based on total amount of epoxy (A), active ester (B), and (C) inorganic filler (% by mass) | 70 | 70 | 70 | 70 | 70 | 70 |
| Content of phenoxy resin based on total amount of epoxy (A) and active ester (B) (% by mass) | 5 | 5 | 0 | 5 | 5 | 0 |
| Content of curing accelerator based on total amount of epoxy (A) and active ester (B) (% by mass) | 0.5 | 0.5 | 0.5 | 0.5 | 0.5 | 0.5 |
| Glass transition temperature (° C.) | 183 | 185 | 181 | 184 | 186 | 184 |
| Evaluation of glass transition temperature (° C.) | ◎ | ◎ | ◎ | ◎ | ◎ | ◎ |
| Dielectric loss tangent (10 GHz) | 0.002 | 0.003 | 0.003 | 0.002 | 0.003 | 0.003 |
| Coefficient of linear thermal expansion (ppm) | 19 | 20 | 20 | 20 | 21 | 20 |

TABLE 2

| Components blended (parts by mass in terms of solid content) | | Example | | | | | | | | | | |
|---|---|---|---|---|---|---|---|---|---|---|---|---|
| | | 14 | 15 | 16 | 17 | 18 | 19 | 20 | 21 | 22 | 23 | 24 |
| (A) Epoxy resin | EPICLON(R) EXA-835LV | 20 | 20 | 20 | 20 | 20 | — | — | — | — | — | — |
| | TEPIC(R)-VL | — | — | — | — | — | 20 | 20 | — | — | — | — |
| | jER(R) 630 | — | — | — | — | — | — | — | 20 | 20 | — | — |
| | jER(R) 604 | — | — | — | — | — | — | — | — | — | 20 | 20 |
| | NC-3000H | 80 | 80 | 80 | 80 | 80 | 80 | 80 | 80 | 80 | 80 | 80 |
| | ESN-475V | — | — | — | — | — | — | — | — | — | — | — |
| (B) Compound having active ester group | B-1 (Synthesis Example 1) | — | — | — | — | — | — | — | — | — | — | — |
| | B-2 (Synthesis Example 2) | 457 | 228 | 152 | 152 | 152 | 248 | 166 | 277 | 185 | 256 | 171 |
| (C) Inorganic filler | SO-C2 | 1299 | 766 | 588 | 588 | 588 | 813 | 620 | 880 | 664 | 831 | 632 |
| Phenoxy resin | jER(R) YX6954BH30 | — | — | — | 13 | — | — | — | — | — | — | — |
| | jER(R) YX7200B35 | — | — | — | — | 13 | 17 | 13 | 19 | 14 | 18 | 14 |
| Curing accelerator | Dimethylaminopyridine | 2.8 | 1.6 | 1.3 | 1.3 | 1.3 | 1.7 | 1.3 | 1.9 | 1.4 | 1.8 | 1.4 |
| Epoxy group/active ester group *1 | | 0.2 | 0.4 | 0.6 | 0.6 | 0.6 | 0.4 | 0.6 | 0.4 | 0.6 | 0.4 | 0.6 |
| Content of (C) inorganic filler based on total amount of epoxy (A), active ester (B), and (C) inorganic filler (% by mass) | | 70 | 70 | 70 | 70 | 70 | 70 | 70 | 70 | 70 | 70 | 70 |
| Content of phenoxy resin based on total amount of epoxy (A) and active ester (B) (% by mass) | | 0 | 0 | 0 | 5 | 5 | 5 | 5 | 5 | 5 | 5 | 5 |
| Content of curing accelerator based on total amount of epoxy (A) and active ester (B) (% by mass) | | 0.5 | 0.5 | 0.5 | 0.5 | 0.5 | 0.5 | 0.5 | 0.5 | 0.5 | 0.5 | 0.5 |
| Glass transition temperature (° C.) | | 170 | 175 | 177 | 183 | 184 | 183 | 186 | 183 | 187 | 185 | 187 |
| Evaluation of glass transition temperature (° C.) | | ○ | ○ | ○ | ◎ | ◎ | ◎ | ◎ | ◎ | ◎ | ◎ | ◎ |
| Dielectric loss tangent (10 GHz) | | 0.001 | 0.002 | 0.003 | 0.003 | 0.003 | 0.002 | 0.003 | 0.002 | 0.003 | 0.002 | 0.003 |
| Coefficient of linear thermal expansion (ppm) | | 17 | 17 | 18 | 18 | 18 | 18 | 18 | 18 | 18 | 17 | 18 |

TABLE 3

| Components blended (parts by mass in terms of solid content) | | Example | | | | | | Comparative Example | |
|---|---|---|---|---|---|---|---|---|---|
| | | 25 | 26 | 27 | 28 | 29 | 30 | 1 | 2 |
| (A) Epoxy resin | EPICLON(R) EXA-835LV | 20 | 20 | 20 | 20 | 20 | 20 | 20 | 20 |
| | TEPIC(R)-VL | — | — | — | — | — | — | — | — |
| | jER(R) 630 | — | — | — | — | — | — | — | — |
| | jER(R) 604 | — | — | — | — | — | — | — | — |
| | NC-3000H | — | — | — | — | — | — | 80 | 80 |
| | ESN-475V | 80 | 80 | 80 | 80 | 80 | 80 | — | — |

TABLE 3-continued

| Components blended (parts by mass in terms of solid content) | | Example | | | | | | Comparative Example | |
|---|---|---|---|---|---|---|---|---|---|
| | | 25 | 26 | 27 | 28 | 29 | 30 | 1 | 2 |
| (B) Compound having active ester group | B-1 (Synthesis Example 1) | 412 | 206 | 137 | — | — | — | 885 | 89 |
| | B-2 (Synthesis Example 2) | — | — | — | 425 | 213 | 142 | — | — |
| (C) Inorganic filler | SO-C2 | 1195 | 714 | 554 | 1225 | 729 | 564 | 2299 | 440 |
| Phenoxy resin | jER(R) YX6954BH30 | — | — | — | — | — | — | — | — |
| | jER(R) YX7200B35 | — | — | — | — | — | — | — | — |
| Curing accelerator | Dimethylaminopyricline | 2.6 | 1.5 | 1.2 | 2.6 | 1.6 | 1.2 | 4.9 | 0.9 |
| Epoxy group/active ester group *1 | | 0.2 | 0.4 | 0.6 | 0.2 | 0.4 | 0.6 | 0.1 | 1 |
| Content of (C) inorganic filler based on total amount of epoxy (A), active ester (B), and (C) inorganic filler (% by mass) | | 70 | 70 | 70 | 70 | 70 | 70 | 70 | 70 |
| Content of phenoxy resin based on total amount of epoxy (A) and active ester (B) (% by mass) | | 0 | 0 | 0 | 0 | 0 | 0 | 0 | 0 |
| Content of curing accelerator based on total amount of epoxy (A) and active ester (B) (% by mass) | | 0.5 | 0.5 | 0.5 | 0.5 | 0.5 | 0.5 | 0.5 | 0.5 |
| Glass transition temperature (° C.) | | 170 | 174 | 175 | 171 | 173 | 174 | * | 167 |
| Evaluation of glass transition temperature (° C.) | | ○ | ○ | ○ | ○ | ○ | ○ | — | X |
| Dielectric loss tangent (10 GHz) | | 0.002 | 0.002 | 0.003 | 0.001 | 0.002 | 0.002 | * | 0.005 |
| Coefficient of linear thermal expansion (ppm) | | 21 | 21 | 21 | 19 | 20 | 20 | * | 24 |

The details of the components in Tables 1 to 3 are as follows.

EPICLON® EXA-835LV (manufactured by DIC Corporation, mixed item of a bisphenol A type epoxy resin and a bisphenol F type epoxy resin, liquid, epoxy equivalent: 165 g/eq)

TEPIC-VL (manufactured by Nissan Chemical Corporation, heterocyclic epoxy resin, trifunctional, liquid, epoxy equivalent: 128 g/eq)

jER® 630: Epoxy resin having the following chemical structural formula as the main component (manufactured by Mitsubishi Chemical Corporation, aromatic amino epoxy resin, trifunctional, liquid, epoxy equivalent: 97 g/eq)

[Formula 15]

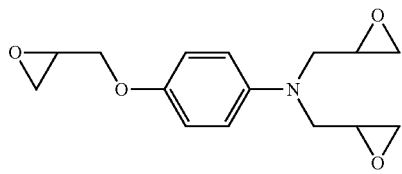

jER® 604: Epoxy resin having the following chemical structural formula as the main component (manufactured by Mitsubishi Chemical Corporation, aromatic amino epoxy resin, tetrafunctional, semisolid, epoxy equivalent: 118 g/eq)

[Formula 16]

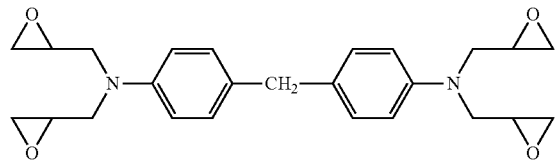

NC-3000H (manufactured by Nippon Kayaku Co., Ltd., biphenyl novolac type epoxy resin, solid, epoxy equivalent: 290 g/eq)

ESN-475V (manufactured by Nippon Steel Chemical Co., Ltd., naphthalene type epoxy resin, solid, epoxy equivalent: 322 g/eq)

B-1: Produced by Synthesis Example 1 (Active ester equivalent: 223 g/eq)

B-2: Produced by Synthesis Example 2 (Active ester equivalent: 230 g/eq)

SO-C2: Spherical silica treated with phenylamino silane (average particle size: 0.5 μm, amount of carbon per unit mass 0.18) (manufactured by Admatechs Company Limited)

jER® YX7200B35: phenoxy resin (manufactured by Mitsubishi Chemical Corporation)

*1: The ratio of the total amount of the epoxy groups of (A) epoxy resins/the total amount of the active ester groups of (B) a compound having an active ester group in a composition

TABLE 4

| Components blended (parts by mass in terms of solid content) | | Example | | | | | | | | | | | | | Comp. Ex. | | |
|---|---|---|---|---|---|---|---|---|---|---|---|---|---|---|---|---|---|
| | | 31 | 32 | 33 | 34 | 35 | 36 | 37 | 38 | 39 | 40 | 41 | 42 | 43 | 3 | 4 | 5 |
| (A-1) Epoxy resin | jER(R)630 | 10 | 10 | 30 | 30 | 60 | 60 | | | | | | | | | 30 | 30 |
| | jER(R)604 | | | | | | | 10 | 10 | 30 | 30 | 60 | 60 | 60 | | | |
| (A-2) Epoxy resin | EPICLON(R) EXA-835LV | | | | | | | | | | | | | | 30 | | |
| | NC-3000H | 90 | 90 | 70 | 70 | 40 | 40 | 90 | 90 | 70 | 70 | 40 | 40 | 40 | 70 | 70 | 70 |
| (B) Active ester resin | B-1 (Synthesis Example 1) | 307 | | 409 | | 562 | | 294 | | 368 | | 480 | | | | 1228 | |
| | B-2 (Synthesis Example 2) | | 317 | | 422 | | 580 | | 303 | | 380 | | 496 | 496 | 324 | | 127 |
| (C) Filler | SO-C2 | 950 | 973 | 1188 | 1218 | 1545 | 1587 | 919 | 940 | 1093 | 1120 | 1354 | 1390 | 1529 | 990 | 3099 | 529 |
| Curing accelerator | 1B2PZ | 2.0 | 2.1 | 2.5 | 2.6 | 3.3 | 3.4 | 2.0 | 2.0 | 2.3 | 2.4 | 2.9 | 3.0 | 3.0 | 2.1 | 6.6 | 1.1 |
| (A-1)/((A-1) + (A-2)) (mass ratio) | | 0.1 | 0.1 | 0.3 | 0.3 | 0.6 | 0.6 | 0.1 | 0.1 | 0.3 | 0.3 | 0.6 | 0.6 | 0.6 | 0.0 | 0.3 | 0.3 |
| Epoxy group/ester group *1 | | 0.3 | 0.3 | 0.3 | 0.3 | 0.3 | 0.3 | 0.3 | 0.3 | 0.3 | 0.3 | 0.3 | 0.3 | 0.3 | 0.3 | 0.1 | 1.0 |
| Filler content (% by mass) | | 70.0 | 70.0 | 70.0 | 70.0 | 70.0 | 70.0 | 70.0 | 70.0 | 70.0 | 70.0 | 70.0 | 70.0 | 70.0 | 70.0 | 70.0 | 70.0 |
| Evaluation of glass transition temperature (° C.) | | ○ | ○ | ⊚ | ⊚ | ⊚ | ⊚ | ○ | ○ | ⊚ | ⊚ | ⊚ | ⊚ | ⊚ | ○ | * | X |
| Evaluation of dielectric loss tangent (10 GHz) | | ⊚ | ⊚ | ⊚ | ⊚ | ⊚ | ⊚ | ⊚ | ⊚ | ⊚ | ⊚ | ⊚ | ⊚ | ⊚ | ⊚ | * | X |
| Evaluation of peel strength | | ⊚ | ⊚ | ⊚ | ⊚ | ○ | ○ | ⊚ | ⊚ | ⊚ | ⊚ | ○ | ○ | ⊚ | X | * | ○ |

The details of the components in Table 4 are as follows.

jER® 630: Epoxy resin having the following chemical structural formula as the main component (manufactured by Mitsubishi Chemical Corporation, aromatic amino epoxy resin, trifunctional, liquid, epoxy equivalent: 97 g/eq)

[Formula 17]

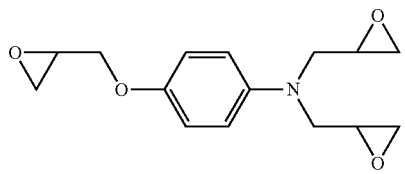

jER® 604: Epoxy resin having the following chemical structural formula as the main component (manufactured by Mitsubishi Chemical Corporation, aromatic amino epoxy resin, tetrafunctional, semisolid, epoxy equivalent: 118 g/eq)

[Formula 18]

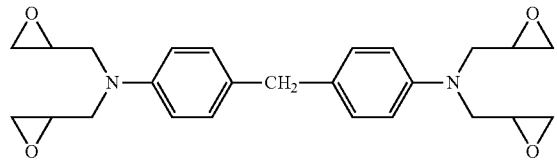

EPICLON® EXA-835LV (mixed item of a bisphenol A type epoxy resin and a bisphenol F type epoxy resin, liquid, epoxy equivalent: 165 g/eq) (manufactured by DIC Corporation)

NC-3000-H: Biphenyl skeleton-containing polyfunctional solid epoxy resin (manufactured by Nippon Kayaku Co., Ltd., solid, epoxy equivalent: 290 g/eq)

B-1: Produced by Synthesis Example 1 (Active Ester equivalent: 223 g/eq)

B-2: Produced by Synthesis Example 2 (Active ester equivalent: 230 g/eq)

SO-C2: Spherical silica treated with phenylamino silane (average particle size: 0.5 μm, amount of carbon per unit mass 0.18) (manufactured by Admatechs Company Limited)

jER® YX6954 BH30: phenoxy resin (manufactured by Mitsubishi Chemical Corporation)

IB2PZ: 1-benzyl-2-phenylimidazole

*1: The ratio of the total amount of the epoxy groups of (A) epoxy resins/the total amount of the active ester groups of (B) a compound having an active ester group in a composition It was shown in Examples 1 to 30 that the cured products have all of high heat resistances, low dielectric loss tangents, and low coefficients of linear thermal expansion were obtained from the curable resin composition. It was shown in Examples 31 to 43 that the curable resin compositions have all of high heat resistances, high adhesions, and low dielectric loss tangents.

The invention claimed is:

1. A curable resin composition, comprising:
an epoxy resin;
an inorganic filler:
a curing accelerator; and
a compound having an active ester group,
wherein the curing accelerator includes at least one selected from the group consisting of an imidazole, an imidazole derivative, and an amine, a ratio of the total amount of epoxy groups in the epoxy resin/the total amount of active ester groups in the compound having an active ester group in the curable resin composition is in a range of 0.2 to 0.6, the epoxy resin includes a biphenyl aralkyl type epoxy resin and at least one compound selected from the group consisting of bisphenol A type epoxy resin and bisphenol F type epoxy resin, the compound having an active ester group is selected from the group consisting of a compound of formula (1),

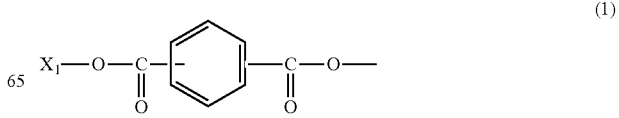

(1)

-continued

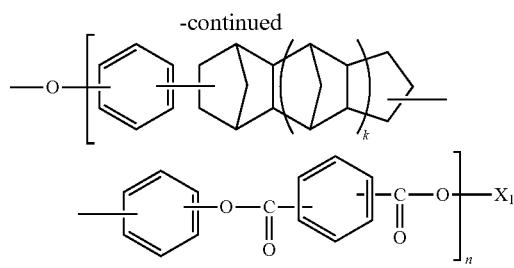

where each $X_1$, independently from each other, is a group having a benzene ring or a naphthalene ring, k is 0 or 1, and n as an average number of repeating units is in a range of 0.25 to 1.5, and a compound having a structural moiety of formula (2), (2)

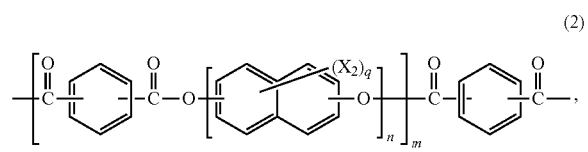

where the compound having the structural moiety of the formula (2) has a structure with monovalent aryloxy groups at both ends thereof, m is an integer in a range of 1 to 6, each n, independently from each other, is an integer in a range of 1 to 5, and each q, independently from each other, is an integer in a range of 1 to 6, and each $X_2$, independently from each other, is a group of formula (3), (3)

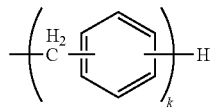

where each k, independently from each other, is an integer in a range of 1 to 5, or a group of formula (4), (4)

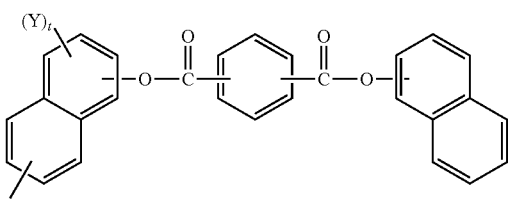

where Y is a group of the formula (3), each k, independently from each other, is an integer in a range of 1 to 5, and each t, independently from each other, is an integer in a range of 0 to 5.

2. The curable resin composition according to claim 1, wherein the compound having an active ester group is the compound of formula (1), (1)

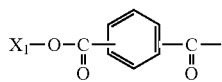

-continued

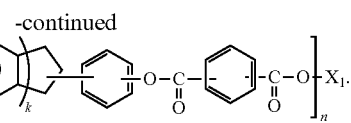

3. The curable resin composition according to claim 1, wherein the compound having an active ester group is the compound having a structural moiety of formula (2), (2)

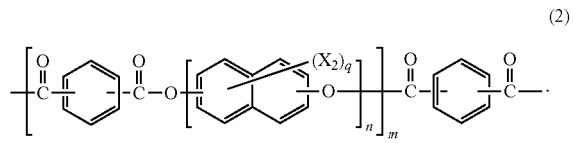

4. The curable resin composition according to claim 1, wherein the inorganic filler comprises silica such that an amount of the silica is at least 65% by mass with respect to 100% by mass of a solid content in the curable resin composition.

5. A dry film, comprising:
   a resin layer comprising the curable resin composition of claim 1.

6. A resin-clad copper foil, comprising:
   a copper foil; and
   a resin layer formed on the copper foil and comprising the curable resin composition of claim 1.

7. A cured product obtained by a process comprising curing the curable resin composition of claim 1.

8. An electronic component, comprising:
   the cured product of claim 7.

9. A resin-clad copper foil, comprising:
   a copper foil having a carrier; and
   a resin layer formed on the copper foil and comprising the curable resin composition of claim 1.

10. The curable resin composition according to claim 2, wherein the inorganic filler comprises silica such that an amount of the silica is at least 65% by mass with respect to 100% by mass of a solid content in the curable resin composition.

11. A dry film, comprising:
    a resin layer comprising the curable resin composition of claim 2.

12. A resin-clad copper foil, comprising:
    a copper foil; and
    a resin layer formed on the copper foil and comprising the curable resin composition of claim 2.

13. A cured product obtained by a process comprising curing the curable resin composition of claim 2.

14. The curable resin composition according to claim 3, wherein the inorganic filler comprises silica such that an amount of the silica is at least 65% by mass with respect to 100% by mass of a solid content in the curable resin composition.

15. A dry film, comprising:
    a resin layer comprising the curable resin composition of claim 3.

16. A resin-clad copper foil, comprising:
    a copper foil; and
    a resin layer formed on the copper foil and comprising the curable resin composition of claim 3.

17. The curable resin composition according to claim 1, wherein the curable accelerator includes the amine.

18. The curable resin composition according to claim 1, wherein the curable accelerator includes dimethylaminopyridine.

19. The curable resin composition according to claim 1, wherein the ratio of the total amount of epoxy groups in the epoxy resin/the total amount of active ester groups in the compound having an active ester group in the curable resin composition is in a range of 0.2 to 0.4.

20. The curable resin composition according to claim 1, wherein the ratio of the total amount of epoxy groups in the epoxy resin/the total amount of active ester groups in the compound having an active ester group in the curable resin composition is in a range of 0.2 to 0.3.

* * * * *